US012581592B2

(12) United States Patent
Xiao et al.

(10) Patent No.: US 12,581,592 B2
(45) Date of Patent: Mar. 17, 2026

(54) FLEXIBLE PRINTED CIRCUIT BOARD AND TOUCH-CONTROL DISPLAY APPARATUS

(71) Applicants:Chengdu BOE Optoelectronics Technology Co., Ltd., Chengdu (CN); BOE Technology Group Co., Ltd., Beijing (CN)

(72) Inventors: Yunhan Xiao, Beijing (CN); Fan Li, Beijing (CN); Congcong Li, Beijing (CN); Dong Wang, Beijing (CN); Huinan Shi, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 274 days.

(21) Appl. No.: 18/284,079

(22) PCT Filed: Jan. 9, 2023

(86) PCT No.: PCT/CN2023/071210
§ 371 (c)(1),
(2) Date: Sep. 26, 2023

(87) PCT Pub. No.: WO2023/142989
PCT Pub. Date: Aug. 3, 2023

(65) Prior Publication Data
US 2024/0155761 A1      May 9, 2024

(30) Foreign Application Priority Data
Jan. 29, 2022    (CN) ......................... 202210112906.7

(51) Int. Cl.
H05K 1/02         (2006.01)
G06F 3/044       (2006.01)
H05K 1/11         (2006.01)

(52) U.S. Cl.
CPC ............. *H05K 1/028* (2013.01); *H05K 1/111* (2013.01); *G06F 3/0446* (2019.05); *G06F 2203/04112* (2013.01); *H05K 2201/10128* (2013.01)

(58) Field of Classification Search
None
See application file for complete search history.

(56) References Cited

U.S. PATENT DOCUMENTS 11,419,212 B2 *    8/2022    Xiong ..................... H05K 1/147
11,500,489 B2 *   11/2022    Xiong ................... G06F 1/1643
(Continued)

FOREIGN PATENT DOCUMENTS

CN          105989912 A       10/2016
CN          107015407 A        8/2017
(Continued)

OTHER PUBLICATIONS

International Search Report for PCT/CN2023/071210 Mailed Apr. 7, 2023.

*Primary Examiner* — Timothy J Thompson
*Assistant Examiner* — John B Freal
(74) *Attorney, Agent, or Firm* — Ling Wu; Stephen Yang; Ling and Yang Intellectual Property

(57)          ABSTRACT

A flexible printed circuit board includes a main flexible board and a bridging flexible board, wherein the main flexible board includes a first main pad, a second main pad, a first signal line and a second signal line, and the bridging flexible board includes a first bridging pad and a second bridging pad; the first main pad includes at least two first solder joints, the second main pad includes at least two second solder joints, the first bridging pad includes at least two third solder joints, and the second bridging pad includes at least two fourth solder joints.

20 Claims, 9 Drawing Sheets

(56)                     References Cited

U.S. PATENT DOCUMENTS

| | | | | |
|---|---|---|---|---|
| 11,589,461 | B2 * | 2/2023 | Xiong .................. | H05K 1/0237 |
| 11,765,828 | B2 * | 9/2023 | Xiong .................... | H05K 1/118 |
| | | | | 174/254 |
| 11,934,606 | B2 * | 3/2024 | Xiong .................... | H05K 1/147 |
| 11,991,828 | B2 * | 5/2024 | Xiong ................. | G06F 3/04164 |
| 2017/0164478 | A1 | 6/2017 | Lee | |
| 2019/0064239 | A1 | 2/2019 | Lee et al. | |
| 2022/0256706 | A1 | 8/2022 | Xiong et al. | |

FOREIGN PATENT DOCUMENTS

| | | | |
|---|---|---|---|
| CN | 107801291 | A | 3/2018 |
| CN | 109427864 | A | 3/2019 |
| CN | 110996556 | A | 4/2020 |
| CN | 113301710 | A | 8/2021 |
| JP | 2005-242392 | A | 9/2005 |
| JP | 2006-190984 | A | 7/2006 |

* cited by examiner

FLEXIBLE PRINTED CIRCUIT BOARD AND TOUCH-CONTROL DISPLAY APPARATUS

CROSS-REFERENCE TO RELATED APPLICATIONS

This application is a national stage application of PCT Application No. PCT/CN2023/071210, which is filed on Jan. 9, 2023 and claims the priority of Chinese Patent Application No. 202210112906.7, filed to the CNIPA on Jan. 29, 2022 and entitled "FLEXIBLE PRINTED CIRCUIT BOARD AND TOUCH-CONTROL DISPLAY APPARATUS", the content of which should be regarded as being incorporated herein by reference.

TECHNICAL FIELD

The present disclosure relates to, but is not limited to, the field of display technologies, in particular to a flexible printed circuit board and a touch-control display apparatus.

BACKGROUND

With rapid development of display technologies, touch screens have been gradually widespread in people's daily life. According to composition structures, types of touch screens may be divided into Add on Mode type, On Cell type, In Cell type, and so on. According to working principles thereof, types of touch screens may be divided into capacitive type, resistive type, infrared type, surface acoustic wave type, and so on. The capacitive On Cell type includes a display panel, a touch panel and a Flexible Printed Circuit (FPC). The touch panel is disposed on a light-emitting side of the display panel, and the display panel and the touch panel are connected with external devices through the flexible circuit board.

SUMMARY

The following is a summary of subject matter described herein in detail. The summary is not intended to limit the protection scope of claims.

In one aspect, the present disclosure provides a flexible printed circuit board including a main flexible board and a bridging flexible board, wherein the main flexible board includes, at least, a first main pad, a second main pad, at least one first signal line and at least one second signal line, and the bridging flexible board includes, at least, a first bridging pad, a second bridging pad and at least one connection line; the first main pad includes at least two first solder joints, the second main pad includes at least two second solder joints, the first signal line is connected with one first solder joint, and the second signal line is connected with one second solder joint; the first bridging pad includes at least two third solder joints, the second bridging pad includes at least two fourth solder joints, a first end of the connection line is connected with a third solder joint, and a second end of the connection line is connected with a fourth solder joint; the first solder joint is connected with the third solder joint by solder, and the second solder joint is connected with the fourth solder joint by solder; the flexible printed circuit board further includes any one or more of a first auxiliary line, a second auxiliary line, a third auxiliary line, and a fourth auxiliary line; a first end of the first auxiliary line is connected with the first signal line, and a second end of the first auxiliary line is connected with another first solder joint; a first end of the second auxiliary line is connected with the second signal line, and a second end of the second auxiliary line is connected with another second solder joint; a first end of the third auxiliary line is connected with the connection line, and a second end of the third auxiliary line is connected with another third solder joint; a first end of the fourth auxiliary line is connected with the connection line, and a second end of the fourth auxiliary line is connected with another fourth solder joint.

In an exemplary implementation, the main flexible board includes a touch drive circuit and at least one terminal, a first end of the first signal line is connected to the terminal, a second end of the first signal line is connected to a first solder joint of the first main pad, a first end of the second signal line is connected to the touch drive circuit, and a second end of the second signal line is connected to a second solder joint of the second main pad.

In an exemplary implementation, the first main pad includes a plurality of first solder joints arranged in a matrix manner in a solder joint array, wherein the plurality of first solder joints include at least one first functional solder joint located inside the solder joint array and at least one first non-functional solder joint located outside the solder joint array, the first signal line is connected with the first functional solder joint, and the first auxiliary line is connected with the first non-functional solder joint.

In an exemplary implementation, the second main pad includes a plurality of second solder joints arranged in a matrix manner in a solder joint array, wherein the plurality of second solder joints include at least one second functional solder joint located inside the solder joint array and at least one second non-functional solder joint located outside the solder joint array, the second signal line is connected with the second functional solder joint, and the first auxiliary line is connected with the second non-functional solder joint.

In an exemplary implementation, the first bridging pad includes a plurality of third solder joints arranged in a matrix manner in a solder joint array, wherein the plurality of third solder joints include at least one third functional solder joint located inside the solder joint array and at least one third non-functional solder joint located outside the solder joint array, the connection line is connected with the third functional solder joint, and the third auxiliary line is connected with the third non-functional solder joint.

In an exemplary implementation, the second bridging pad includes a plurality of fourth solder joints arranged in a matrix manner in a solder joint array, wherein the plurality of fourth solder joints include at least one fourth functional solder joint located inside the solder joint array and at least one fourth non-functional solder joint located outside the solder joint array, the connection line is connected with the fourth functional solder joint, and the fourth auxiliary line is connected with the fourth non-functional solder joint.

In an exemplary embodiment, the bridging flexible board includes a connection line region, a first pad region and a second pad region. The connection line region is disposed between the first pad region and the second pad region. The connection line is disposed in the connection line region, the first bridging pad is disposed in the first pad region, and the second bridging pad is disposed in the second pad region. A first connection point where the third auxiliary line is connected with the connection line is located in the connection line region, and/or a second connection point where the fourth auxiliary line is connected with the connection line is located in the connection line region.

In an exemplary implementation, the bridging flexible board includes a connection line region, a first pad region and a second pad region. The connection line region is disposed between the first pad region and the second pad region. The connection line is disposed in the connection line region. The first pad region includes a first solder joint region and a first glue dispensing region, wherein the first solder joint region is disposed in the first bridging pad, and the first glue dispensing region is disposed at a periphery of the first solder joint region. The second solder joint region includes a second solder joint region and a second glue dispensing region, wherein the second bridging pad is disposed in the second solder joint region, and the second glue dispensing region is disposed at a periphery of the second solder joint region. A first connection point where the third auxiliary line is connected with the connection line is located in the first glue dispensing region, and/or a second connection point where the fourth auxiliary line is connected with the connection line is located in the second glue dispensing region.

In an exemplary implementation, a center distance between adjacent first solder joints ranges from 1.05 mm to 1.25 mm; and/or, a center distance between adjacent second solder joints ranges from 1.05 mm to 1.25 mm; and/or, a center distance between adjacent third solder joints ranges from 1.05 mm to 1.25 mm; and/or, a center distance between adjacent fourth solder joints ranges from 1.05 mm to 1.25 mm.

In an exemplary implementation, the first bridging pad further includes at least one through hole disposed between the adjacent third solder joints; and/or, the second bridging pad further includes at least one through hole disposed between the adjacent fourth solder joints.

In an exemplary implementation, a dimension of the through hole is less than or equal to 0.1 mm, and the dimension of the through hole refers to a maximum distance between any two points on an edge of the through hole.

In an exemplary implementation, a center distance between the through hole and an adjacent third solder joint ranges from 0.55 mm to 0.65 mm; and/or, a center distance between the through hole and the adjacent fourth solder joint ranges from 0.55 mm to 0.65 mm.

In an exemplary implementation, the bridging flexible board is disposed on the main flexible board in a plane perpendicular to the flexible printed circuit board. The bridging flexible board includes a first bridging soldermask layer disposed on the main flexible board, a first bridging conductive layer disposed on a side of the first bridging soldermask layer away from the main flexible board, a bridging substrate layer disposed on a side of the first bridging conductive layer away from the main flexible board, a second bridging conductive layer disposed on a side of the bridging substrate layer away from the main flexible board, and a second bridging soldermask layer disposed on a side of the second bridging conductive layer away from the main flexible board, wherein the first bridging conductive layer is only disposed in the connection line region of the bridging flexible board.

In an exemplary implementation, a distance between an edge of the third solder joint close to a side of the connection line region and an edge of the first bridging conductive layer in the connection line region close to a side of the third solder joint is greater than or equal to 1.0 mm, and/or a distance between an edge of the fourth solder joint close to the side of the connection line region and the edge of the first bridging conductive layer in the connection line region close to the side of the fourth solder joint is greater than or equal to 1.0 mm.

In an exemplary implementation, the main flexible board includes a shielding layer, a covering layer disposed on the shielding layer, a first main conductive layer disposed on a side of the covering layer away from the shielding layer, a main substrate layer disposed on a side of the first main conductive layer away from the shielding layer, a second main conductive layer disposed on a side of the main substrate layer away from the shielding layer, and a main soldermask layer disposed on a side of the second main conductive layer away from the shielding layer, wherein the first bridging soldermask layer of the bridging flexible board is in direct contact with the main soldermask layer.

In another aspect, the present disclosure also provides a touch-control display apparatus. The touch-control display apparatus includes a touch display panel and the aforementioned flexible printed circuit board, wherein the touch display panel includes an effective region and a binding region located on a side of the effective region, the binding region includes a binding pin region, and the flexible printed circuit board are connected with the binding pin region.

Other aspects may be comprehended upon reading and understanding of the drawings and detailed description.

BRIEF DESCRIPTION OF DRAWINGS

Accompanying drawings are intended to provide a further understanding of technical solutions of the present disclosure and form a part of the specification, and are used to explain the technical solutions of the present disclosure together with embodiments of the present disclosure, and do not form limitations on the technical solutions of the present disclosure. Shapes and sizes of each component in the drawings do not reflect actual scales, and are only intended to schematically illustrate contents of the present disclosure.

5

6

Figure 16:
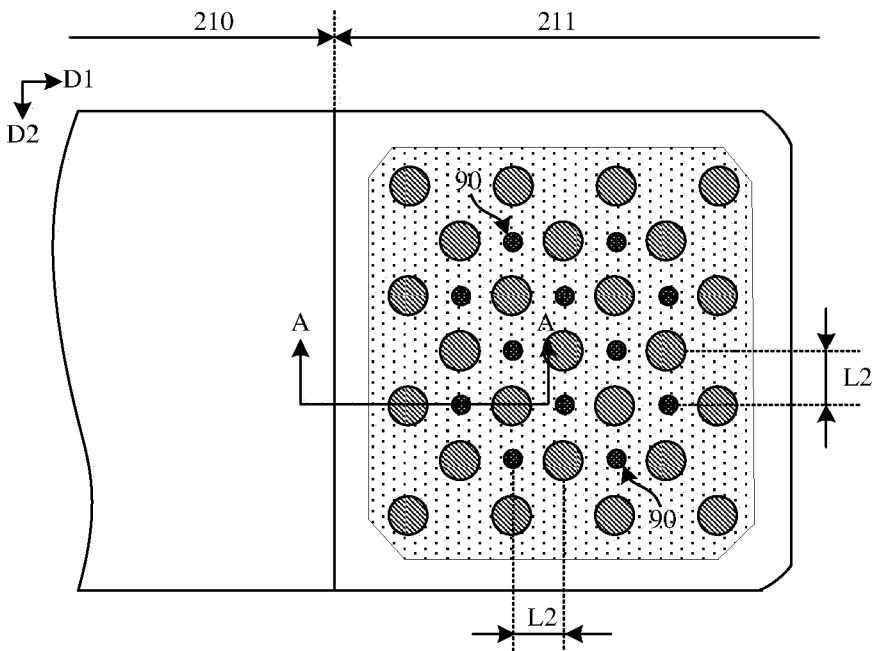
Figure 17:
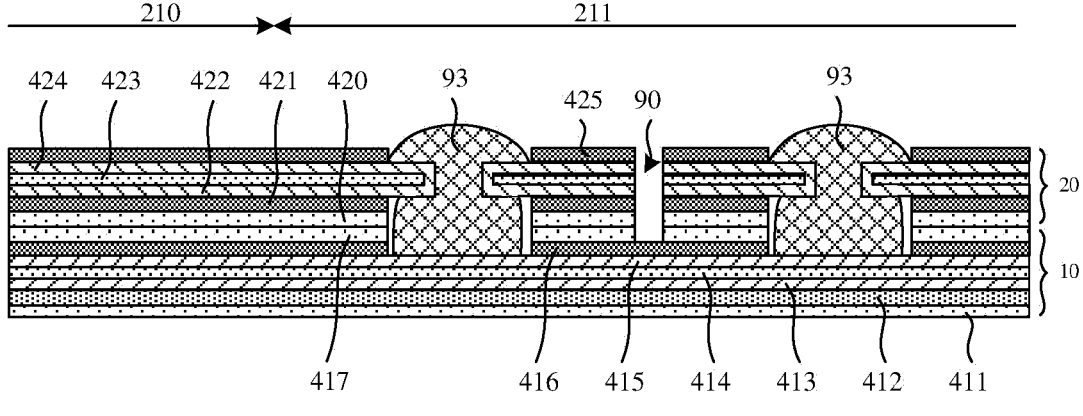
Figure 18:
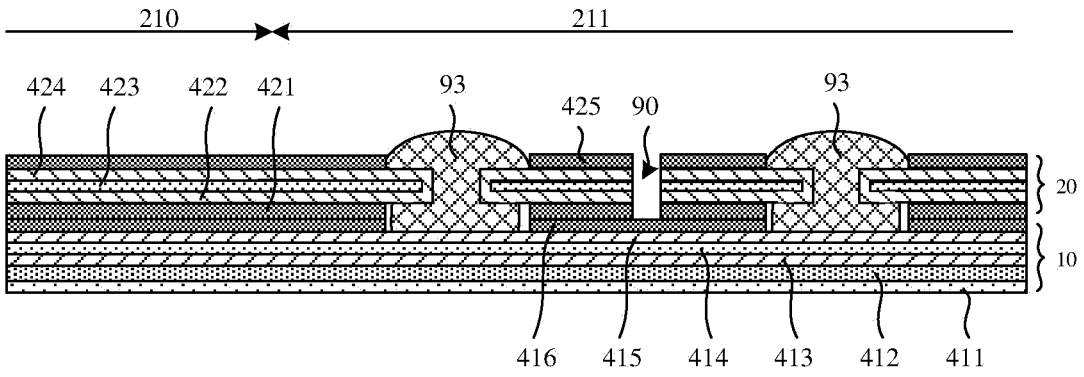
Figure 19:
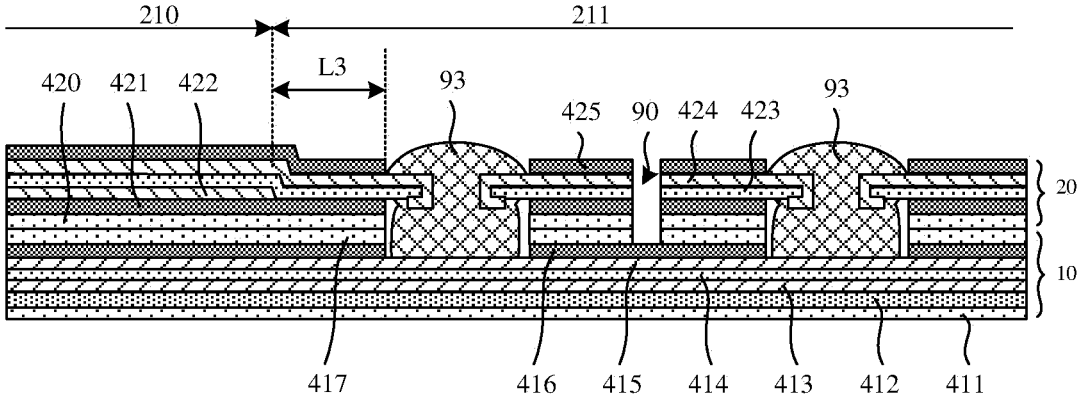
Figure 20:
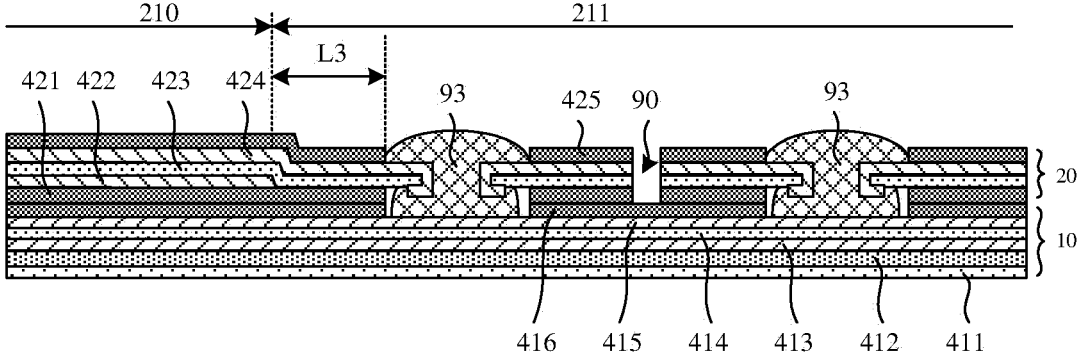

FIG. 16 is a schematic diagram of a planar structure of yet another bridging flexible board in an exemplary embodiment of the present disclosure;

FIG. 17 is a schematic diagram of a cross-sectional structure of a flexible circuit board according to an exemplary embodiment of the present disclosure;

FIG. 18 is a schematic diagram of a cross-sectional structure of another flexible circuit board according to an exemplary embodiment of the present disclosure;

FIG. 19 is a schematic diagram of a cross-sectional structure of yet another flexible circuit board according to an exemplary embodiment of the present disclosure;

FIG. 20 is a schematic diagram of a cross-sectional structure of yet another bridging flexible board according to an exemplary embodiment of the present disclosure.

DESCRIPTION OF REFERENCE NUMBERS

10—Main flexible board; 11—First main pad; 12—Second main pad;

20—Bridging flexible board; 21—First bridging pad; 22—Second bridging pad;

31—Sense lead; 32—Drive lead; 33—Display lead;

40—Flexible printed circuit board; 41—Sensing signal line; 50—Touch drive circuit;

51—First drive signal line; 52—Second drive signal line; 60—Auxiliary devices;

61—Display signal line; 70—Connector; 71—First auxiliary line;

72—Second auxiliary line; 73—Third auxiliary line; 74—Fourth auxiliary line;

81—Connection line; 90—Through hole; 91—First connection point;

92—Second connection point; 93—Solder; 100—Effective region;

101—Substrate; 102—Driver IC layer; 103—Light-emitting structure layer;

104—Encapsulation structure layer; 105—Buffer layer; 106—First metal grid layer;

107—Insulating layer; 108—Second metal grid layer; 109—Protective layer;

110—First touch unit; 111—First touch electrode; 112—First connection portion;

120—Second touch unit; 121—Second touch electrode; 122—Second connection portion;

200—Binding region; 201—First fan-out region; 202—Bending region;

203—Second fan-out region; 204—Antistatic region; 205—Driver chip region;

206—Binding pin region; 210—Connection line region; 211—First pad region;

211-1—First solder joint region; 211-2—First glue dispensing region; 212—Second pad region;

212-1—Second solder joint region; 212-2—Second glue dispensing region; 300—Edge region;

401—Terminal region; 402—Circuit region; 403—Connection region;

411—Outer shielding layer; 412—Covering layer; 413—First main conductive layer;

414—Main substrate layer; 415—Second main conductive layer; 416—Main soldermask layer;

417—Main shielding layer; 420—Bridge shielding layer; 421—First bridging soldermask layer;

422—First bridging conductive layer; 424—Second bridging conductive layer;

425—Second bridging soldermask layer.

DETAILED DESCRIPTION

To make objectives, technical solutions, and advantages of the present disclosure clearer, embodiments of the present disclosure will be described in detail with reference to the accompanying drawings. It is to be noted that implementations may be practiced in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict. In order to keep the following description of the embodiments of the present disclosure clear and concise, detailed descriptions of part of known functions and known components are omitted in the present disclosure. The drawings in the embodiments of the present disclosure relate only to the structures involved in the embodiments of the present disclosure, and other structures may be described with reference to conventional designs.

Scales of the drawings in the present disclosure may be used as a reference in actual processes, but are not limited thereto. For example, a width-length ratio of a channel, a thickness and spacing of each film layer, and a width and spacing of each signal line may be adjusted according to actual needs. The number of pixels in the display substrate and the number of sub-pixels in each pixel are not limited to the numbers shown in the drawings. The drawings described in the present disclosure are schematic structural diagrams only, and one implementation of the present disclosure is not limited to the shapes, numerical values or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection; it may be a mechanical connection or an electrical connection; and it may be a direct mutual connection, or an indirect connection through middleware, or an internal communication between two elements. Those of ordinary skills in the art may understand specific meanings of these terms in the present disclosure according to specific situations.

In the specification, "electrical connection" includes a case that constituent elements are connected together through an element with a certain electrical effect. The "element with a certain electrical effect" is not particularly limited as long as electrical signals may be sent and received between the connected constituent elements. Examples of the "element with a certain electrical effect" not only include electrodes and wirings, but also include switch elements such as transistors, resistors, inductors, capacitors, other elements with various functions, etc.

Triangle, rectangle, trapezoid, pentagon, hexagon, etc. in this specification are not strictly defined, and they may be approximate triangle, rectangle, trapezoid, pentagon, hexagon, etc. There may be some small deformations caused by tolerance, and there may be chamfer, arc edge, deformation, etc.

In the specification, "parallel" refers to a state in which an angle formed by two straight lines is above $-10°$ and below $10°$, and thus also includes a state in which the angle is above $-5°$ and below $5°$. In addition, "perpendicular" refers to a state in which an angle formed by two straight lines is above $80°$ and below $100°$, and thus also includes a state in which the angle is above $85°$ and below $95°$.

In the present disclosure, "about" refers to that a boundary is defined not so strictly and numerical values within process and measurement error ranges are allowed.

Structures of capacitive On Cell type touch panels are mainly classified into a mutual capacitance structure and a self-capacitance structure. The mutual capacitance structure refers to forming mutual capacitance by a first touch electrode and a second touch electrode and performing position detection based on a change of the mutual capacitance. The self-capacitance structure refers to forming self-capacitance by a touch electrode and a human body and performing position detection based on a change of the self-capacitance. A self-capacitance touch panel has a single-layer structure, and has characteristics of low power consumption, and simple structure, etc. A mutual capacitance touch panel has a multi-layer structure, and has characteristics of multi-point touch, etc.

The touch-control display apparatus may include a display panel disposed on a substrate and a touch panel disposed on the display panel. The display panel may be a Liquid Crystal Display (LCD) panel, an Organic Light Emitting Diode (OLED) display panel, a Plasma Display Panel (PDP), or an Electrophoretic Display (EPD) panel. In an exemplary implementation, the display panel may be an OLED display panel. An OLED is an active light emitting display device that has advantages of self-luminescence, wide viewing angle, high contrast, low power consumption, extremely high response speed, and the like. With continuous development of display technologies, a flexible display that uses an OLED as a light emitting device and a Thin Film Transistor (TFT) to perform signal control has become the majority in the field of display at present. According to product requirements such as flexible foldability and narrow bezel, etc., an existing touch structure based on the OLED is in a form of a Flexible Multi-Layer On Cell (FMLOC) structure. Both of a display structure and a touch structure are integrated on a base substrate, and the touch panel is disposed on an encapsulation layer of an OLED back panel to form an on-cell structure, which has advantages of lightness, thinness, foldability and the like, and may meet product requirements on flexible foldability and narrow bezels.

Figure 1:
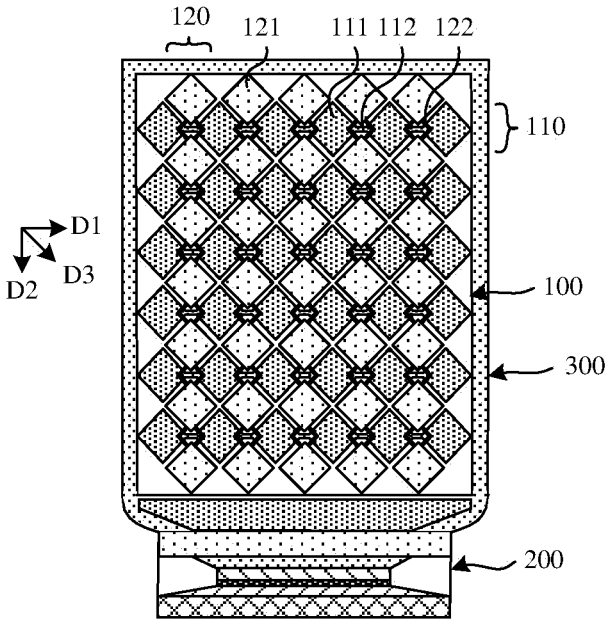
FIG. 1 illustrates a schematic view of a planar structure of a touch-control display apparatus.

FIG. 1 is a schematic diagram of a planar structure of a touch-control display apparatus. A touch panel is disposed on a display panel to form an FMLOC structure. In a plane parallel to the touch panel, the touch panel may include an effective region (AA) 100, a binding region 200 at a side of the effective region 100, and an edge region 300 at other sides of the effective region 100. For the display panel and the touch panel which are stacked, the effective region may be either a touch region of the touch panel or a display region of the display panel, and both the touch region and the display region in the following description refer to the effective region. In an exemplary implementation, the effective region 100 includes, at least, a plurality of touch electrodes disposed regularly, the edge region 300 includes, at least, a plurality of touch leads, and the binding region 200 includes, at least, pins connecting the touch leads to an external control apparatus.

In an exemplary implementation, the touch panel may have a mutual capacitance structure. The effective region 100 may include a plurality of first touch units 110 and a plurality of second touch units 120, wherein the first touch units 110 have a linear shape extending along a first direction D1 and the plurality of first touch units 110 are disposed in sequence along a second direction D2. The second touch units 120 have a linear shape extending along the second direction D2 and the plurality of second touch units 120 are disposed in sequence along the first direction D1, wherein the first direction D1 intersects with the second direction D2. Each first touch unit 110 may include a plurality of first touch electrodes 111 and first connection portions 112 which are arranged sequentially along the first direction D1, and the first touch electrodes 111 and the first connection portion 112 are disposed alternately and electrically connected sequentially. Each second touch unit 120 may include a plurality of second touch electrodes 121 arranged sequentially along the second direction D2, and the plurality of second touch electrodes 121 are disposed at intervals. Adjacent second touch electrodes 121 are electrically connected to each other by a second connection portion 122. In an exemplary implementation, a film layer where the second connection portions 122 are located is different from a film layer where the first touch electrodes 111 and the second touch electrodes 121 are located. The first touch electrodes 111 and the second touch electrodes 121 are alternately arranged along a third direction D3, and the third direction D3 intersects with the first direction D1 and the second direction D2.

In an exemplary implementation, the plurality of first touch electrodes 111, the plurality of second touch electrodes 121, and the plurality of first connection portions 112 may be disposed on a same layer, i.e., the touch layer, and may be formed by a same patterning process, and the first touch electrodes 111 and the first connection portions 112 may be connected to each other in an integrated structure. The second connection portions 122 may be disposed on a bridging layer, and adjacent second touch electrodes 121 are connected to each other through vias. An insulating layer is disposed between the touch layer and the bridging layer. In some possible implementations, the plurality of first touch electrodes 111, the plurality of second touch electrodes 121 and the plurality of second connection portions 122 may be disposed on a same layer, i.e., the touch layer, wherein the second touch electrodes 121 and the second connection portions 122 may be connected to each other in an integrated structure. The first connection portions 112 may be disposed on the bridging layer and adjacent first touch electrodes 111 are connected to each other through vias.

In an exemplary implementation, the first touch electrodes may be drive (Tx) electrodes and the second touch electrodes may be sensing (Rx) electrodes. Alternatively, the first touch electrodes may be sensing (Rx) electrodes and the second touch electrodes may be drive (Tx) electrodes.

In an exemplary implementation, shapes of the first touch electrode and the second touch electrode may include any one or more of the following: triangle, square, rectangle, diamond, parallelogram, trapezoid, pentagon, hexagon, which are not limited in the present disclosure.

In an exemplary implementation, the first touch electrodes and the second touch electrodes may be in a form of transparent conductive electrodes. In another exemplary implementation, the first touch electrodes and the second touch electrodes may be in a form of metal meshes. The metal mesh is formed by a plurality of interweaving metal wires and includes a plurality of mesh patterns, wherein the mesh patterns are polygons formed a plurality of metal wires. The first touch electrodes and the second touch electrodes in the form of the metal mesh have advantages of small resistance, small thickness, fast response speed, and the like.

Figure 2:
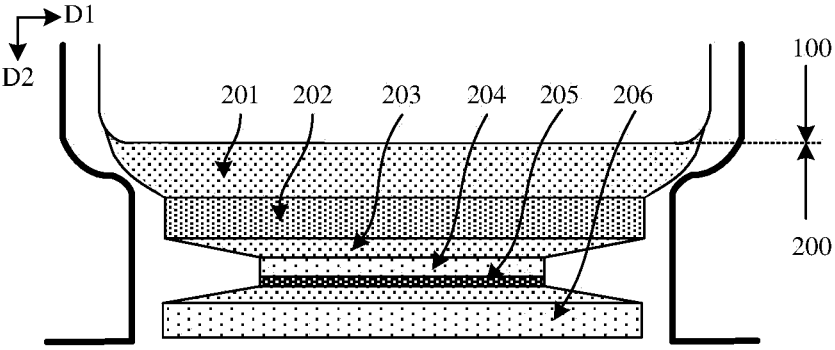
FIG. 2 is a schematic diagram of a planar structure of a binding region in a touch-control display apparatus.

FIG. 2 is a schematic diagram of a planar structure of a binding region in a touch-control display apparatus. As shown in FIG. 2, in an exemplary implementation, the binding region 200 may be located on a side of the effective region 100. Along a direction away from the effective region 100 (the second direction D2), the binding region 200 may include a first fan-out region 201, a bending region 202, a second fan-out region 203, an antistatic region 204, a drive chip region 205, and a binding pin region 206 which are disposed in sequence. The first fan-out region 201 may be provided with a plurality of touch leads and a plurality of signal transmission lines. The signal transmission lines includes, at least, a first power supply line (VDD), a second power supply line (VSS) and a plurality of data transmission lines, wherein the plurality of data transmission lines are configured to be connected to data lines of the display panel in a fan-out manner, the first power supply line VDD is configured to connect to a high-level power supply line of the display panel and the second power supply line VSS is configured to connect to a low-level power supply line of the display panel. A groove may be formed in the bending region 202. The groove is configured to bend the second fan-out region 203, the antistatic region 204, the drive chip region 205, and the binding pin region 206 to a back surface of the effective region 100. The second fan-out region 203 may be provided with a plurality of touch leads and a plurality of data transmission lines which are led out in a fan-out manner. The antistatic region 204 may be provided with an anti-static circuit which is configured to eliminate static electricity. The drive chip region 205 may be provided with a source driver IC, which is configured to connect to the plurality of data transmission lines in the second fan-out region 203. The binding pin region 206 may be provided, at least, with a plurality of binding pins (also referred to as connecting fingers) which are configured to bind to and connect to a Flexible Printed Circuit (FPC for short) board.

Figure 3:
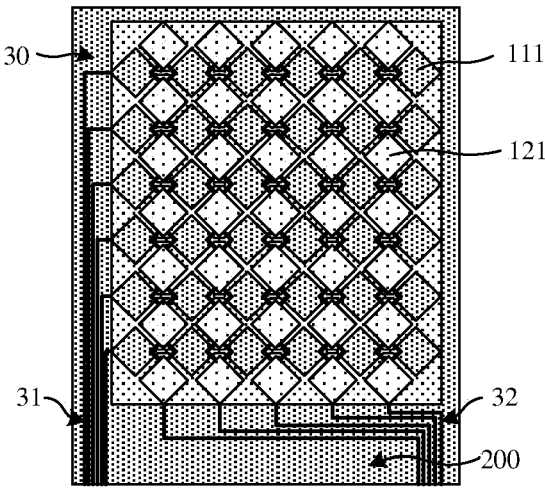
FIG. 3 is a schematic diagram of a planar structure of an edge region in a touch-control display apparatus.

FIG. 3 is a schematic diagram of a planar structure of an edge region in a touch-control display apparatus. As shown in FIG. 3, in an exemplary implementation, the edge region 300 may be located on a side of the effective region 100 besides the side where the binding region 200 is located. In an exemplary implementation, taking the first touch electrode 111 as a sensing (Rx) electrode and the second touch electrode 121 as a driving (Tx) electrode as an example, the edge region 300 may be provided with a plurality of sense leads 31 and a plurality of drive leads 32. In an exemplary implementation, a first end of the sense lead 31 is connected to a sense electrode, a second end of the sense lead 31 extends along the edge region 300 to a side of the binding region 200, a first end of the drive lead 32 is connected to the drive electrode, a second end of the drive lead 32 extends to another side of the binding region 200, and the sense lead 31 along with the drive lead 32 form a touch lead.

Figure 4:
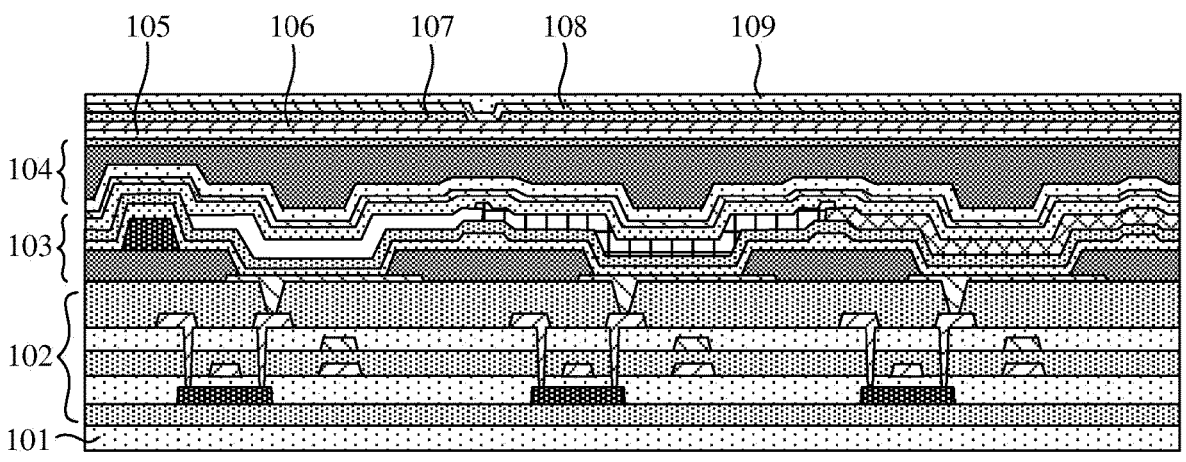
FIG. 4 is a schematic diagram of a cross-sectional structure of an effective region in a touch-control display apparatus.

FIG. 4 is a schematic diagram of a cross-sectional structure of an effective region in a touch-control display apparatus, illustrating a structure of three sub-pixels. As shown in FIG. 4, a touch panel may be disposed on a display panel in a plane perpendicular to the touch-control display apparatus. In an exemplary implementation, the display panel may include a drive circuit layer 102 disposed on a base substrate 101, a light-emitting structure layer 103 disposed on a side of the drive circuit layer 102 away from the base substrate 101, and an encapsulation structure layer 104 disposed on a side of the light-emitting structure layer 103 away from the base substrate 101.

In an exemplary implementation, the base substrate may be a flexible base substrate, or a rigid base substrate. A drive circuit layer 102 of each sub-pixel may include a plurality of transistors and a storage capacitor constituting a pixel drive circuit, in FIG. 4, each pixel drive circuit including a transistor and a storage capacitor is taken as an example for illustration. In an exemplary implementation, the drive circuit layer 102 of each sub-pixel may include: a first insulating layer disposed on the base substrate; an active layer disposed on the first insulating layer; a second insulating layer overlying the active layer; a gate electrode and a first electrode plate disposed on the second insulating layer; a third insulating layer overlying the gate electrode and the first electrode plate; a second electrode plate disposed on the third insulating layer; a fourth insulating layer overlying the second electrode plate, wherein the second, third and fourth insulating layers are provided with a via exposing the active layer; a source electrode and a drain electrode disposed on the fourth insulating layer, wherein the source electrode and the drain electrode are connected to the active layer through vias, respectively; and a planarization layer overlying aforementioned structure, wherein the planarization layer is provided with a via exposing the drain electrode. The active layer, the gate electrode, the source electrode and the drain electrode form a drive transistor, and the first electrode plate and the second electrode plate form a storage capacitor.

In an exemplary implementation, a light-emitting structure layer 103 may include an anode, a pixel definition layer, an organic light-emitting layer and a cathode. The anode is disposed on the planarization layer, and is connected to the drain electrode of the drive transistor through a via formed in the planarization layer. The pixel definition layer is disposed on the anode and the planarization layer, and a pixel opening is provided in the pixel definition layer and exposes the anode. The organic light-emitting layer is connected with the anode through the pixel opening, and the cathode is connected with the organic light-emitting layer. In an exemplary implementation, the organic light-emitting layer may include an Emitting Layer (EML), and one or more following film layers: a Hole Injection Layer (HIL), a Hole Transport Layer (HTL), a Hole Block Layer (HBL), an Electron Block Layer (EBL), an Electron Transport Layer (ETL), and an Electron Injection Layer (EIL). When driven by a voltage between the anode and the cathode, light emitting properties of organic materials are utilized according to a required gray scale.

In an exemplary implementation, the encapsulation structure layer 104 may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is disposed between the first encapsulation layer and the third encapsulation layer, which may ensure that external water vapor cannot enter the light-emitting structure layer 103.

In an exemplary implementation, on a plane perpendicular to the touch-control display apparatus, the touch panel may include a buffer layer 105 disposed on a side of the encapsulation structure layer 104 away from the base substrate 101; a first metal mesh layer (TMA) 106 disposed on a side of the buffer layer 105 away from the base substrate 101; an insulating layer 107 disposed on a side of the first metal mesh layer 106 away from the base substrate 101; a second metal mesh (TMB) layer 108 disposed on a side of the insulating layer 107 away from the base substrate 101, and a protective layer 109 disposed on a side of the second metal mesh layer 108 away from the base substrate 101.

In an exemplary implementation, the buffer layer 105 and the insulating layer 107 may be made of any one or more of silicon oxide (SiOx), silicon nitride (SiNx), and silicon oxynitride (SiON), and may be in a form of a single layer, multi-layer or composite layer. The first metal mesh layer 106 and the second metal mesh layer 108 may be made of a metal material, such as any one or more of silver (Ag), copper (Cu), aluminum (Al), titanium (Ti), and molybdenum (Mo), or alloy materials of the aforementioned metals, and the protective layer 109 may be made of an organic material.

In an exemplary implementation, the first metal mesh layer 106 may be referred to as a bridging layer, and the second metal mesh layer 108 may be referred to as a touch layer. A plurality of first touch electrodes, second touch electrodes and first connection portions may be disposed on a same layer on the touch layer, and second connection portions may be disposed on the bridging layer, so that adjacent second touch electrodes are connected to each other through vias.

Figure 5:
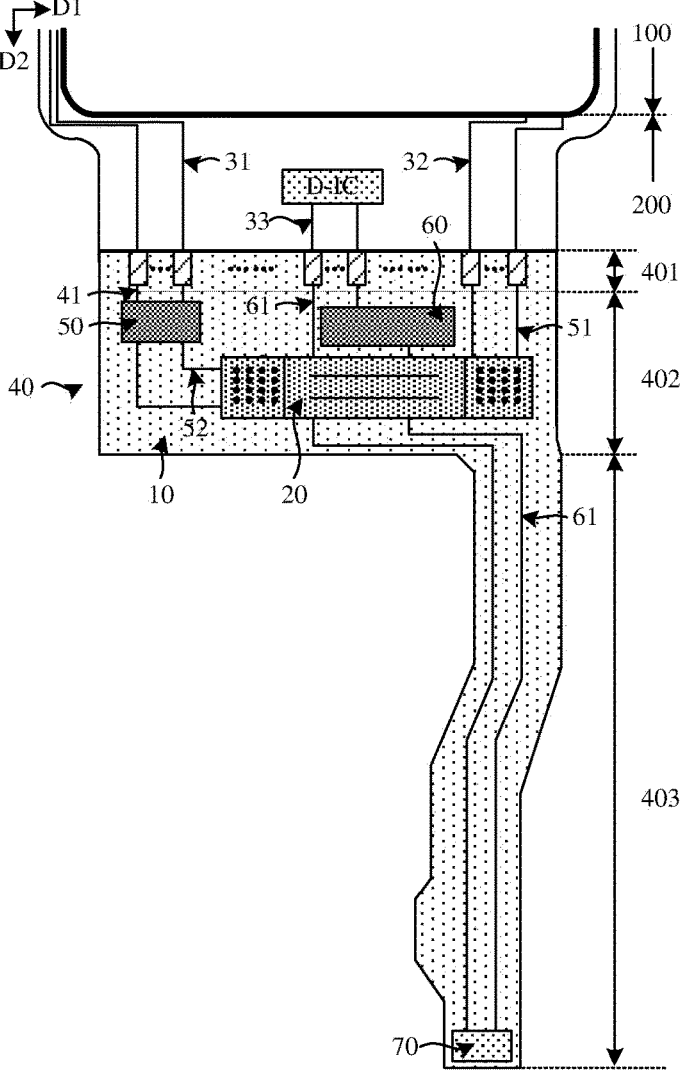
FIG. 5 is a schematic diagram of binding connection of a flexible printed circuit board.
Figure 6:
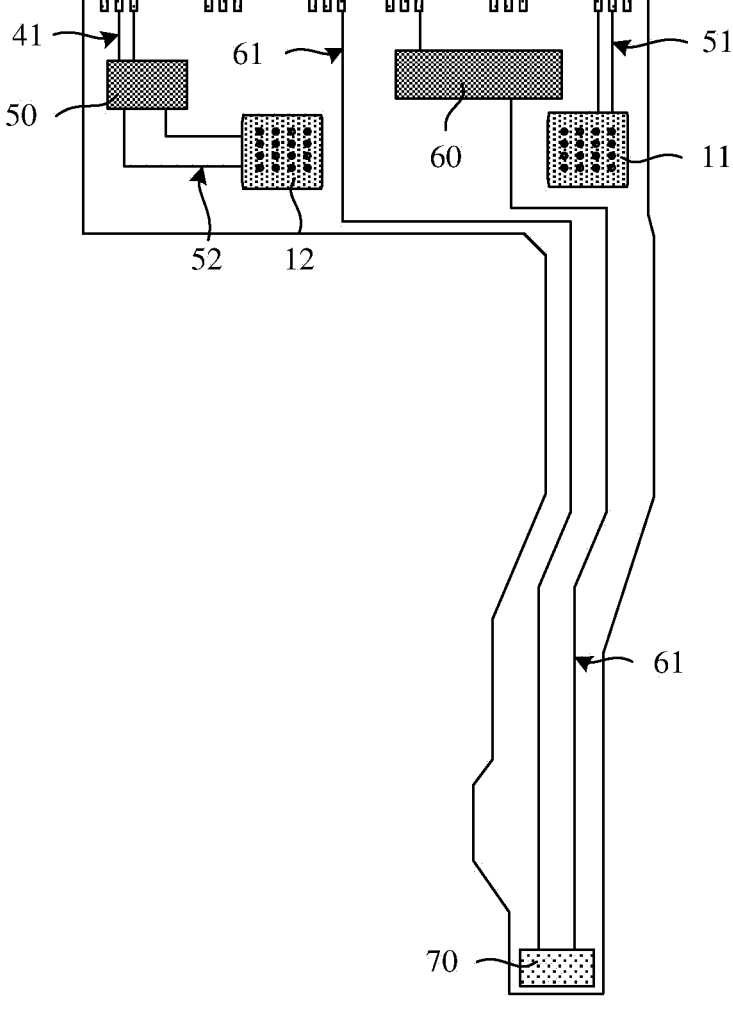
FIG. 6 is a schematic diagram of a planar structure of a main flexible board in a flexible printed circuit board.
Figure 7:
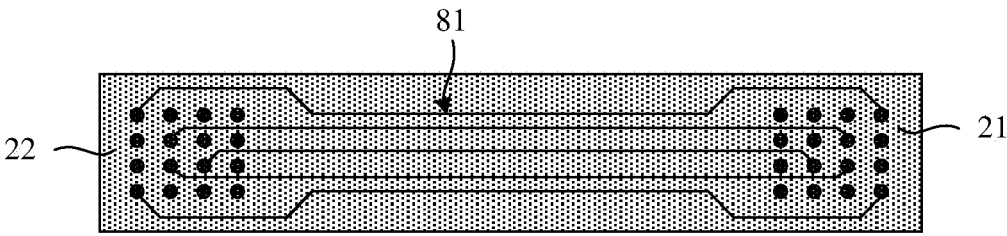
FIG. 7 is a schematic diagram of a planar structure of a bridging flexible board in a flexible printed circuit board.

FIG. 5 is a schematic diagram of binding connection of a flexible printed circuit board, FIG. 6 is a schematic diagram of a planar structure of a main flexible board in a flexible printed circuit board, and FIG. 7 is a schematic diagram of a planar structure of a bridging flexible board in a flexible printed circuit board. In an exemplary implementation, along a direction parallel to an edge of a binding region (i.e., a first direction D1), the binding region 200 may be divided into a first side region, a middle region, and a second side region. The edge of the binding region refers to an edge of the binding region adjacent to a touch region. In the following description, a left side of the binding region refers to the first side region of the binding region, a right side of the binding region refers to the second side region of the binding region, and middle of the binding region refers to a middle region between the left side of the binding region and the right side of the binding region. In an exemplary implementation, a binding pin region 206 in the binding region 200 may include a first pin region located in the first side region, a middle pin region located in the middle region and a second pin region located in the second side region. Each of the first pin region, the middle pin region, and the second pin region includes a plurality of pins.

In an exemplary implementation, a plurality of sense leads 31 are introduced from a bezel region to the left side of the binding region, extend to the first pin region at the left side of the binding region, and are connected to a plurality of pins of the first pin region, correspondingly. The plurality of drive leads 32 are introduced from the bezel region to the right side of the binding region, extended to the second pin region at the right side of the binding region, and are correspondingly connected to a plurality of pins of the second pin region. A plurality of display leads 33 are introduced to the middle pin region from a source driver IC (D-IC) located in middle of the binding region, and are correspondingly connected to a plurality of pins in the middle pin region.

As shown in FIGS. 5-7, in an exemplary implementation, the flexible printed circuit board 40 may include a main flexible board 10 on which a main pad may be provided, and a bridging flexible board 20 on which a bridging pad may be provided, the bridging pad may be soldered to the main pad by molten solder paste to form a double-layer bridging flexible printed circuit board.

In an exemplary implementation, the main flexible board 10 of the flexible printed circuit board 40 is located on a side of the binding region 200 away from the effective region 100. Along a direction away from the touch region 100 (i.e., the second direction D2), the main flexible board 10 may include a terminal region 401, a circuit region 402, and a connection region 403 which are disposed in sequence.

In an exemplary implementation, the terminal region 401 may include a plurality of terminals that are bound to a plurality of pins to the binding pin region, correspondingly. The plurality of terminals in the terminal region 401 may be arranged regularly along the first direction D1 and the terminal region 401 may be divided into a first terminal region, a middle terminal region and a second terminal region. A position of the first terminal region corresponds to a position of the first pin region of the binding region, and a plurality of terminals of the first terminal region are connected to a plurality of pins of the first pin region, correspondingly. A position of the middle terminal region corresponds to a position of the middle pin region of the binding region, and a plurality of terminals of the middle terminal region are connected to a plurality of pins of the middle region, correspondingly. A position of the second terminal region corresponds to a position of the second pin region of the binding region, and a plurality of terminals of the second terminal region are connected to a plurality of pins of the second pin region, correspondingly.

In an exemplary implementation, the circuit region 402 may include, at least, a first main pad 11, a second main pad 12, a touch drive circuit (i.e., Touch IC) 50, an auxiliary device 60, a plurality of sensing signal lines 41, a plurality of first drive signal lines 51, a plurality of second drive signal lines 52, and a plurality of display signal lines 61. Along the first direction D1, the touch drive circuit 50 may be located on the left side of the circuit region 402, the auxiliary device 60 may be located on the right side of the circuit region 402, and the first and second main pads 11 and 12 may be located on the side of the auxiliary device 60 away from the terminal region 401. In an exemplary implementation, the first main pad 11 and the second main pad 12 are configured to connect to the bridging pad on the bridging flexible board 20, the touch drive circuit 50 is configured to connect to a plurality of sensing signal lines 41 and a plurality of second drive signal lines 52, and the auxiliary device 60 is configured to connect to a plurality of display signal lines 61.

In an exemplary implementation, the connection region 403 may include, at least, a Connector 70 and a plurality of display signal lines 61, wherein the connector 70 is configured to connect to the plurality of display signal lines 61. Along the first direction D1, a width of the connection region 403 may be less than a width of the circuit region 402, and the connection region 403 may be located on the right side of the circuit region 402. In an exemplary implementation, the connector 70 may be located at a terminal of the connection region 403 on a side away from the circuit region 402. In an exemplary embodiment, the connector may serve as an external connection interface, and may be a Board-to-board (BTB) connector.

In an exemplary implementation, the first ends of the plurality of sensing signal lines 41 are connected, correspondingly, with the plurality of terminals of the first terminal region, and are connected in correspondence with the plurality of sense leads 31 on the left side of the binding region through the plurality of terminals of the first terminal region and the plurality of pins of the first pin region. second ends of the plurality of sense signal lines 41 extend to the touch drive circuit 50 and are connected to the touch drive circuit 50, such that a connection between the touch drive circuit 50 and the plurality of sense leads 31 in the binding region is achieved, and the touch drive circuit 50 may provide touch sense signals to the plurality of sense leads 31. Since both the first terminal region and the touch drive circuit 50 are located on the left side of the circuit region 402, the plurality of sensing signal lines 41 can be directly connected to the touch drive circuit 50.

In an exemplary implementation, the first main pad 11 may include a plurality of first solder joints, and the second main pad 12 may include a plurality of second solder joints. First ends of the plurality of first drive signal lines 51 are connected, correspondingly, to a plurality of terminals in the second terminal region, and are connected, correspondingly, to the plurality of drive leads 32 in the binding region through a plurality of terminals in the second terminal region and a plurality of pins in the second pin region. The second ends of the plurality of first drive signal lines 51 extend to the first main pad 11 and are connected to a plurality of first solder joints on the first main pad 11, correspondingly. First ends of the plurality of second drive signal lines 52 are connected to the touch drive circuit 50, and second ends of the plurality of second drive signal lines 52 extend to the second main pad 12 and are connected to the plurality of second solder joints on the second main pad 12.

In an exemplary implementation, since the second terminal region is located on the right side of the circuit region 402 and the touch drive circuit 50 is located on the left side of the circuit region 402, it's necessary for the first drive signal line 51 and the second drive signal line 52 to connect to each other by the bridging flexible board 20, extending from the right side of the circuit region 402 to the left side of the circuit region 402 across the plurality of display signal lines 61, so that the touch drive circuit 50 is connected to a plurality of drive leads 32 in the binding region, and the touch drive circuit 50 supplies a touch drive signal to the plurality of drive leads 32.

In an exemplary implementation, the first ends of the plurality of display signal lines 61 are connected, correspondingly, with the plurality of terminals of the middle terminal region, and are connected, correspondingly, with the plurality of display leads 33 of the binding region through the plurality of terminals of the middle terminal region and the plurality of pins of the binding region. Second ends of a part of the plurality of display signal lines 61 extend directly from the circuit region 402 to the connection region 403, and are connected to the connector 70 located in the connection region, and second ends of another part of the plurality of display signal lines 61 are connected to the connector 70 in the connection region by the auxiliary device 60, so that a connection between the connector 70 and the plurality of display leads 33 in the binding region is achieved, and an external control apparatus may provide display signals to the plurality of display leads 33 through the connector 70.

In an exemplary implementation, the bridging flexible board 20 is configured to be connected to the first main pad 11 and the second main pad 12 on the main flexible board 10. The bridging flexible board 20 may include, at least, a first bridging pad 21, a second bridging pad 22, and a plurality of connection lines 81. The first bridging pad 21 may include a plurality of third solder joints. The second bridging pad 22 may include a plurality of fourth solder joints. first ends of the plurality of connection lines 81 may connect the plurality of third solder joints of the first bridging pad 21, correspondingly. Second ends of the plurality of connection lines 81 may connect the plurality of fourth solder joints of the second bridging pad 22, correspondingly. Therefore, the plurality of third solder joints and the plurality of fourth solder joints are connected correspondingly through the plurality of connection lines 81.

In an exemplary implementation, the plurality of third solder joints of the first bridging pad 21 and the plurality of first solder joints of the first main pad 11 are soldered correspondingly by molten solder paste, and the plurality of fourth solder joints of the second bridging pad 22 and the plurality of second solder joints of the second main pad 11 are soldered correspondingly by molten solder paste, so that the plurality of first drive signal lines 51 and the plurality of second drive signal lines 52 on the main flexible board 10 are connected correspondingly by the bridging flexible board 20.

It is found that existing flexible circuit boards have some problems such as poor connection, and one of main reasons is Open NG caused by faulty soldering pads or less tin. Further study shows that one of the main reasons for missing solder is deformation of a region where the main pad and the bridging pad are located on the flexible printed circuit board, which leads to convex and concave solder joints, which makes distances between the solder joints on the main pad and the bridging pad different, and some solder joints soldered by the solder paste are broken, resulting in Open NG.

A flexible printed circuit board is provided in the present disclosure. The flexible printed circuit board may include a main flexible board and a bridging flexible board, wherein the main flexible board includes, at least, a first main pad, a second main pad, at least one first signal line and at least one second signal line, and the bridging flexible board includes, at least, a first bridging pad, a second bridging pad and at least one connection line. The first main pad includes at least two first solder joints, the second main pad includes at least two second solder joints, the first signal line is connected with one of the first solder joints, and the second signal line is connected with one of the second solder joints. The first bridging pad includes at least two third solder joints, the second bridging pad includes at least two fourth solder joints, a first end of the connection line is connected with the third solder joints, and a second end of the connection line is connected with the fourth solder joints. The first solder joint and the third solder joint are connected by solder, and the second solder joint and the fourth solder joint are connected by solder. The flexible printed circuit board further includes any one or more of a first auxiliary line, a second auxiliary line, a third auxiliary line, and a fourth auxiliary line. A first end of the first auxiliary line is connected with the first signal line, and a second end of the first auxiliary line is connected with another first solder joint. A first end of the second auxiliary line is connected with the second signal line, and a second end of the second auxiliary line is connected with another second solder joint. A first end of the third auxiliary line is connected with the connection line, and a second end of the third auxiliary line is connected with another third solder joint. A first end of the fourth auxiliary line is connected with the connection line, and a second end of the fourth auxiliary line is connected with another fourth solder joint.

In an exemplary implementation, the main flexible board includes a touch drive circuit and at least one terminal, a first end of the first signal line is connected to the terminal, a second end of the first signal line is connected to a first solder joint of the first main pad, a first end of the second signal line is connected to the touch drive circuit, and a second end of the second signal line is connected to a second solder joint of the second main pad.

In an exemplary implementation, the bridging flexible board includes a connection line region, a first pad region and a second pad region. The connection line region is disposed between the first pad region and the second pad region. The connection line is disposed in the connection line region, the first bridging pad is disposed in the first pad region, and the second bridging pad is disposed in the second pad region. A first connection point where the third auxiliary line is connected with the connection line is located in the connection line region, and/or a second connection point where the fourth auxiliary line is connected with the connection line is located in the connection line region.

In an exemplary implementation, the bridging flexible board includes a connection line region, a first pad region and a second pad region. The connection line region is disposed between the first pad region and the second pad region. The connection line is disposed in the connection line region. The first pad region includes a first solder joint region and a first glue dispensing region, wherein the first solder joint region is disposed in the first bridging pad, and the first glue dispensing region is disposed at a periphery of the first solder joint region. The second solder joint region includes a second solder joint region and a second glue dispensing region, wherein the second bridging pad is disposed in the second solder joint region, and the second glue dispensing region is disposed at a periphery of the second solder joint region. A first connection point where the third auxiliary line is connected with the connection line is located in the first glue dispensing region, and/or a second connection point where the fourth auxiliary line is connected with the connection line is located in the second glue dispensing region.

In an exemplary implementation, a center distance between adjacent first solder joints ranges from 1.05 mm to 1.25 mm; and/or, a center distance between adjacent second solder joints ranges from 1.05 mm to 1.25 mm; and/or, a center distance between adjacent third solder joints ranges from 1.05 mm to 1.25 mm; and/or, a center distance between adjacent fourth solder joints ranges from 1.05 mm to 1.25 mm.

In an exemplary implementation, the first bridging pad further includes at least one through hole disposed between the adjacent third solder joints; and/or, the second bridging pad further includes at least one through hole disposed between the adjacent fourth solder joints.

In an exemplary implementation, a dimension of the through hole is less than or equal to 0.1 mm, and the dimension of the through hole refers to a maximum distance between any two points on an edge of the through hole.

In an exemplary implementation, a center distance between the through hole and an adjacent third solder joint ranges from 0.55 mm to 0.65 mm; and/or, a center distance between the through hole and the adjacent fourth solder joint ranges from 0.55 mm to 0.65 mm.

In an exemplary implementation, the bridging flexible board is disposed on the main flexible board in a plane perpendicular to the flexible printed circuit board. The bridging flexible board includes a first bridging soldermask layer disposed on the main flexible board, a first bridging conductive layer disposed on a side of the first bridging soldermask layer away from the main flexible board, a bridging substrate layer disposed on a side of the first bridging conductive layer away from the main flexible board, a second bridging conductive layer disposed on a side of the bridging substrate layer away from the main flexible board, and a second bridging soldermask layer disposed on a side of the second bridging conductive layer away from the main flexible board, wherein the first bridging conductive layer is only disposed in the connection line region of the bridging flexible board.

In an exemplary implementation, a distance between an edge of the third solder joint close to a side of the connection line region and an edge of the first bridging conductive layer in the connection line region close to a side of the third solder joint is greater than or equal to 1.0 mm, and/or a distance between an edge of the fourth solder joint close to the a side of the connection line region and the edge of the first bridging conductive layer in the connection line region close to the side of the fourth solder joint is greater than or equal to 1.0 mm.

In an exemplary implementation, the main flexible board includes a shielding layer, a covering layer disposed on the shielding layer, a first main conductive layer disposed on a side of the covering layer away from the shielding layer, a main substrate layer disposed on a side of the first main conductive layer away from the shielding layer, a second main conductive layer disposed on a side of the main substrate layer away from the shielding layer, and a main soldermask layer disposed on a side of the second main conductive layer away from the shielding layer, wherein the first bridging soldermask layer of the bridging flexible board is in direct contact with the main soldermask layer.

Figure 8:
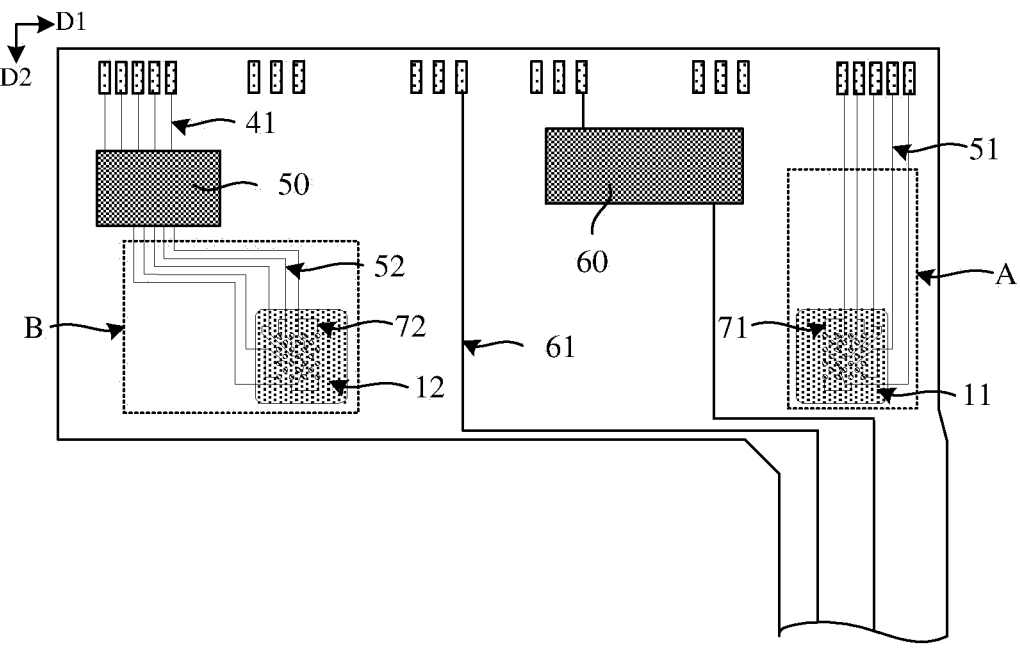
FIG. 8 is a schematic diagram of a planar structure of a main flexible board in an exemplary embodiment of the present disclosure.

FIG. 8 is a schematic diagram of a planar structure of a main flexible board in a flexible printed circuit board according to an exemplary embodiment of the present disclosure. In an exemplary implementation, the main flexible board may include, at least, a first main pad 11, a second main pad 12, a touch drive circuit 50, an auxiliary device 60, a plurality of terminals, a plurality of sensing signal lines 41, a plurality of first drive signal lines 51, a plurality of second drive signal lines 52, and a plurality of display signal lines 61.

In an exemplary implementation, the plurality of terminals may be arranged regularly along the first direction D1 and are configured to connect to a plurality of pins of the binding region, correspondingly. The first main pad 11 may include a plurality of first solder joints configured to connect with a plurality of first drive signal lines 51, correspondingly. The second main pad 12 may include a plurality of second solder joints configured to connect with a plurality of second drive signal lines 52, correspondingly. In an exemplary implementation, the first drive signal line 51 may serve as the first signal line of the present disclosure and the second drive signal line 52 may serve as the second signal line of the present disclosure.

In an exemplary implementation, the first ends of the plurality of display signal lines 61 are connected to a plurality of terminals correspondingly, and the second ends of the plurality of display signal lines 61 are connected to a connector (not shown). In an exemplary implementation, the display signal line 61 may be connected directly to the connector or may be connected to the connector through an auxiliary device 60, which is not limited in the present disclosure.

In an exemplary implementation, the main flexible board may not be provided with an auxiliary device, which is not limited in the present disclosure.

In an exemplary implementation, the first ends of the plurality of sensing signal lines 41 are connected to a plurality of terminals, correspondingly, and the second ends of the plurality of sensing signal lines 41 extend to and are connected to the touch drive circuit 50.

In an exemplary implementation, the first ends of the plurality of first drive signal lines 51 are connected with a plurality of terminals, correspondingly, and the second ends of the plurality of first drive signal lines 51 extend to the first main pad 11 and are connected with the plurality of first solder joints on the first main pad 11, correspondingly. The first ends of the plurality of second drive signal lines 52 are connected to the touch drive circuit 50, and the second ends of the plurality of second drive signal lines 52 extend to the second main pad 12 and are connected to the plurality of second solder joints on the second main pad 12.

In an exemplary implementation, a plurality of first solder joints on the first main pad 11 and a plurality of second solder joints on the second main pad 12 are connected correspondingly through a bridging flexible board, so that a plurality of first drive signal lines 51 and a plurality of second drive signal lines 52 are connected, correspondingly, across a plurality of display signal lines 61.

Figure 9A:
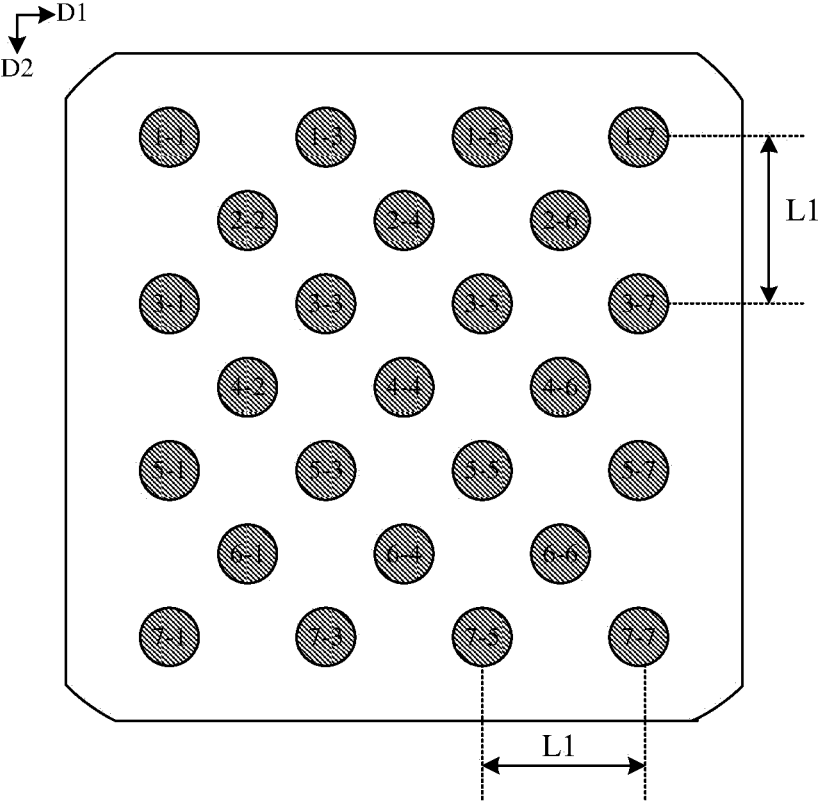
FIG. 9a is a schematic diagram of an arrangement of a plurality of solder joints in an exemplary pad of the present disclosure.

FIG. 9a is a schematic diagram of an arrangement of a plurality of solder joints in an exemplary pad of the present disclosure. As shown in FIG. 9a, in an exemplary implementation, the pad may include 25 solder joints which may be in an arrangement of 7 rows and 7 columns to form a solder joint array. Each of a first row, a third row, a fifth row and a seventh row includes four solder joints disposed in sequence along the first direction D1, and each of a second row, a fourth row and a sixth row includes three solder joints disposed in sequence along the first direction D1, wherein solder joints in adjacent rows are alternated. Each of a first column, a third column, a fifth column and a seventh column includes four solder joints disposed in sequence along the second direction D2, and each of a second column, a fourth column and a sixth column includes three solder joints disposed in sequence along the second direction D2, wherein solder joints in adjacent columns are alternated.

In an exemplary implementation, solder joints located inside the solder joint array may be referred to as functional solder joints, and solder joints located outside the solder joint array may be referred to as non-functional solder joints. For example, the functional solder joints may include: solder joint 2-2, solder joint 2-4, solder joint 2-6, solder joint 3-3, solder joint 3-5, solder joint 4-2, solder joint 4-4, solder joint 4-6, solder joint 5-3, solder joint 5-5, solder joint 6-2, solder joint 6-4, and solder joint 6-6. As another example, the non-functional solder joints may include: solder joint 1-1, solder joint 1-3, solder joint 1-5, solder joint 1-7, solder joint 3-1, solder joint 3-7, solder joint 5-1, solder joint 5-7, solder joint 7-1, solder joint 7-3, solder joint 7-5, and solder joint 7-7.

Figures 9B, 10:
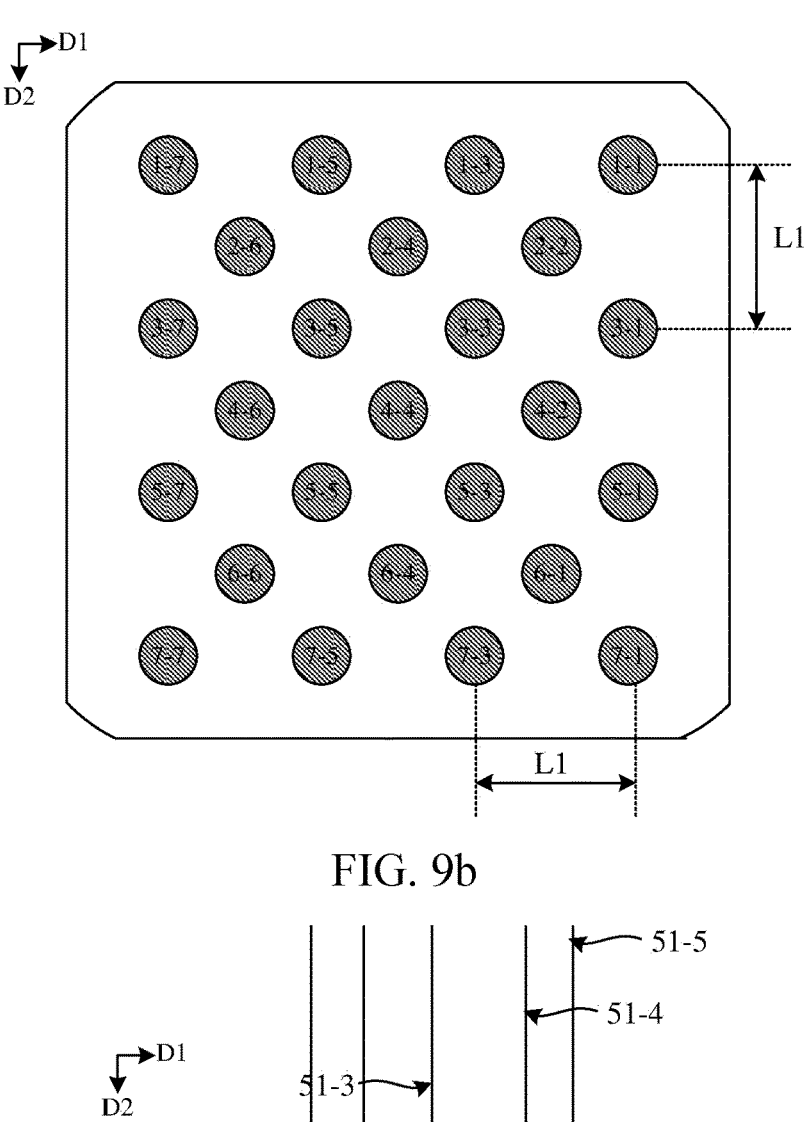
FIG. 9b is a schematic diagram of an arrangement of a plurality of solder joints in another exemplary pad of the present disclosure.
FIG. 10 is an enlarged view of a region A in FIG. 8.

FIG. 9b is a schematic diagram of an arrangement of a plurality of solder joints in another exemplary pad of the present disclosure. As shown in FIG. 9b, the pad may include 25 solder joints which may be in an arrangement of 7 rows and 7 columns to form a solder joint array. Numbers and arrangement of solder joints of the pad are substantially similar to Numbers and arrangement of solder joints of the pads shown in FIG. 9a, except that positions of the 25 solder joints in FIG. 9b and positions of the 25 solder joints in FIG. 9a are symmetrical with respect to the second direction D2.

In an exemplary implementation, a shape of the solder joint may be circular, square, rectangular, polygonal, or the like, and a dimension of the solder joint may be less than or equal to 0.5 mm, and the dimension of the solder joint refers to a maximum value of a distance between any two points on an edge of the solder joint. For example, when the shape of the solder joint is circular, a diameter of the solder joint may be about 0.25 mm, 0.3 mm, 0.35 mm, etc.

In an exemplary implementation, a first center distance L1 between two adjacent solder joints in the first direction D1 may be about 1.05 mm to 1.25 mm, and a first center distance L1 between two adjacent solder joints in a second direction D2 may be about 1.05 mm to 1.25 mm, wherein the first center distance L1 is a distance between a geometric center of one solder joint and a geometric center of another solder joint.

In an exemplary implementation, the numbers and the arrangements of the solder joints on the first and second main pads may be set as required, which are not limited in the present disclosure.

In an exemplary implementation, the first solder joints on the first main pad may be arranged in a form of an arrangement shown in FIG. 9a and the second solder joints on the second main pad may be arranged in a form of an arrangement shown in FIG. 9b.

In an exemplary implementation, the main flexible board may further include at least one first auxiliary line 71, wherein a first end of the first auxiliary line 71 is connected with the first drive signal line 51, and a second end of the first auxiliary line 71 is connected with the first solder joint of the first main pad 11.

In an exemplary implementation, the plurality of first solder joints may include at least one first functional solder joint located inside the solder joint array and at least one first non-functional solder joint located outside the solder joint array. A first end of the first drive signal line 51 is connected to a terminal, and a second end of the first drive signal line 51 is connected to a first functional solder joint. A first end of the first auxiliary line 71 is connected to the first drive signal line 51, and a second end of the first auxiliary line 71 is connected to at least one first non-functional solder joint.

FIG. 10 is an enlarged view of a region A in FIG. 8. Connection between the first drive signal lines and the first solder joints will be described in detail by taking a structure of five first drive signal lines and the first main pad as an example shown in FIG. 9a. As shown in FIG. 10, the five first drive signal lines may include a first drive sub-lines 51-1, a second drive sub-lines 51-2, a third drive sub-lines 51-3, a fourth drive sub-lines 51-4, and a fifth drive sub-lines 51-5, and there are five first auxiliary lines including a first auxiliary sub-line 71-1, a second auxiliary sub-line 71-2, a third auxiliary sub-line 71-3, a fourth auxiliary sub-line 71-4, and a fifth auxiliary sub-line 71-5.

In an exemplary implementation, a first end of the first drive sub-line 51-1 is connected to a terminal, and a second end of the first drive sub-line 51-1 extends toward the first main pad 11 to connect with the functional solder joint 3-3 in the third row and the third column on the first main pad 11. A first end of the first auxiliary sub-line 71-1 is connected with the first drive sub-line 51-1, and a second end of the first auxiliary sub-line 71-1 extends toward the first main pad 11 to connect with the non-functional solder joint 1-1 in the first row and the first column on the first main pad 11. In this way, the first drive sub-line can be connected with two first solder joints on the first main pad by the first auxiliary sub-line, forming a "two (solder joints)-to-one (signal line)" connection mode.

In an exemplary implementation, a first end of the second drive sub-line 51-2 is connected to a terminal, and a second end of the second drive sub-line 51-2 extends toward the first main pad 11 to connect with the functional solder joint 3-5 in the third row and the fifth column on the first main pad 11. A first end of the second auxiliary sub-line 71-2 is connected with the second drive sub-line 51-2, and a second end of the second auxiliary sub-line 71-2 extends toward the first main pad 11 to connect with the non-functional solder joint 1-7 in the first row and the seventh column on the first main pad 11. In this way, the second drive sub-line can be connected with two first solder joints on the first main pad by the second auxiliary sub-line, forming a "two-to-one" connection mode.

In an exemplary implementation, a first end of the third drive sub-line 51-3 is connected to a terminal, and a second end of the third drive sub-line 51-3 extends toward the first main pad 11 to connect with the functional solder joint 4-4 in the fourth row and the fourth column on the first main pad 11. A first end of the third auxiliary sub-line 71-3 is connected to the third drive sub-line 51-3, and a second end of the third auxiliary sub-line 71-3 extends toward the first main pad 11 to connect to the non-functional solder joints 3-7 in the third row and the seventh column on the first main pad 11. In this way, the third drive sub-line can be connected with two first solder joints on the first main pad by the third auxiliary sub-line, forming the "two-to-one" connection mode.

In an exemplary implementation, a first end of the fourth drive sub-line 51-4 is connected to a terminal, and a second end of the fourth drive sub-line 51-4 extends toward the first main pad 11 to connect with the functional solder joint 5-5 in the fifth row and the fifth column on the first main pad 11. A first end of the fourth auxiliary sub-line 71-4 is connected with the fourth drive sub-line 51-4, and a second end of the fourth auxiliary sub-line 71-4 extends toward the first main pad 11 to connect with the non-functional solder joint 7-7 in the seventh row and the seventh column on the first main pad 11. In this way, the fourth drive sub-line can be connected with two first solder joints on the first main pad by the fourth auxiliary sub-line, forming the "two-to-one" connection mode.

In an exemplary implementation, a first end of the fifth drive sub-line 51-5 is connected to a terminal, and a second end of the fifth drive sub-line 51-5 extends toward the first main pad 11 to connect with the functional solder joint 5-3 in the fifth row and the third column on the first main pad 11. A first end of the fifth auxiliary sub-line 71-5 is connected with the fifth drive sub-line 51-5, and a second end of the fifth auxiliary sub-line 71-5 extends toward the first main pad 11 to connect with the non-functional solder joint 7-1 in the seventh row and the first column on the first main pad 11. In this way, the fifth drive sub-line can be connected with two first solder joints on the first main pad by the fifth auxiliary sub-line, forming the "two-to-one" connection mode.

In an exemplary embodiment, at least one functional solder joint may be provided between the functional solder joint to which the first drive signal line is connected and the non-functional solder joint to which an auxiliary line connecting the first drive signal line is connected.

In an exemplary implementation, the main flexible board may further include at least one second auxiliary line 72, wherein a first end of the second auxiliary line 72 is connected with the second drive signal line 52, and a second end of the second auxiliary line 72 is connected with the second solder joint of the second main pad 12.

In an exemplary implementation, the plurality of second solder joints may include at least one second functional solder joint located inside the solder joint array and at least one second non-functional solder joint located outside the solder joint array. The first end of the second drive signal line 52 is connected with the touch drive circuit, and the second end of the second drive signal line 52 is connected to a second functional solder joint. The first end of the second auxiliary line 72 is connected with the second drive signal line 52, and the second end of the second auxiliary line 72 is connected with at least one second non-functional solder joint.

Figure 11:
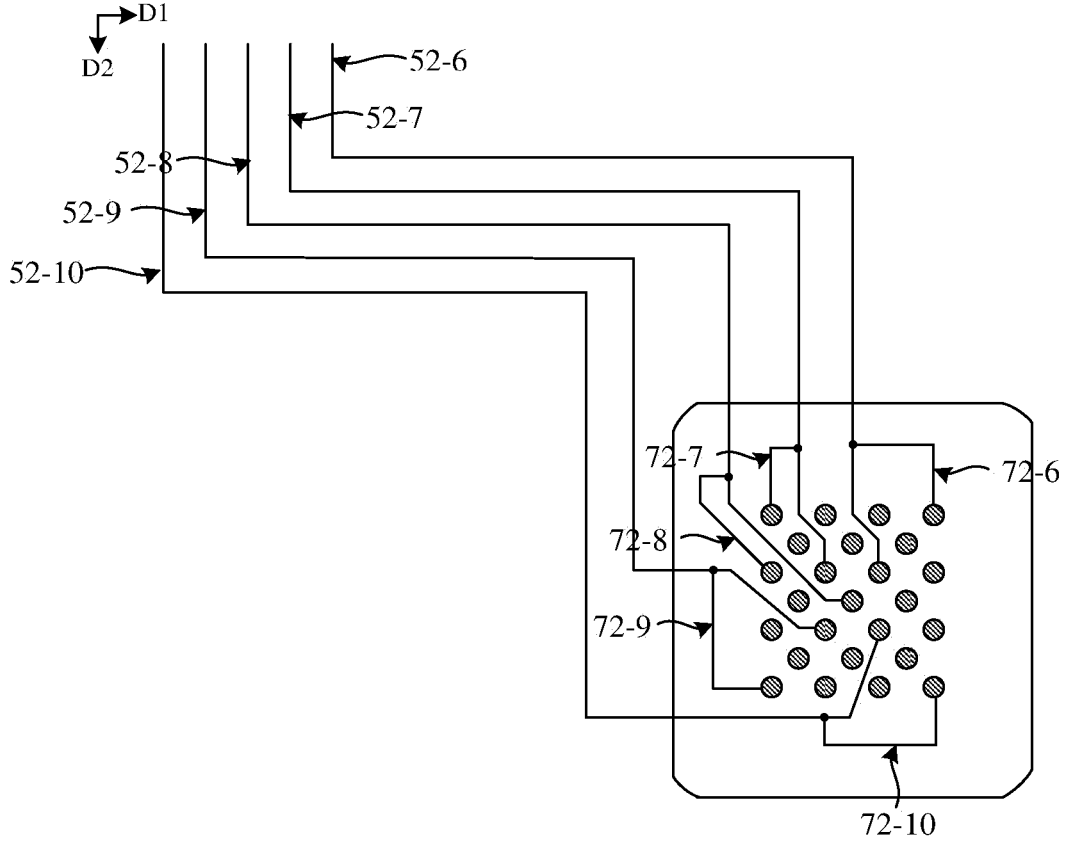
FIG. 11 is an enlarged view of a region B in FIG. 8.

FIG. 11 is an enlarged view of a region B in FIG. 8. Connection between the second drive signal lines and the second solder joints will be described in detail by taking a structure of five second drive signal lines and the second main pad as an example shown in FIG. 9b. As shown in FIG. 11, the five second drive signal lines may include a sixth drive sub-line 52-6, a seventh drive sub-line 52-7, an eighth drive sub-line 52-8, a ninth drive sub-line 52-9, and a tenth drive sub-line 52-10, and the five second auxiliary lines may include a sixth auxiliary sub-line 72-6, a seventh auxiliary sub-line 72-7, an eighth auxiliary sub-line 72-8, a ninth auxiliary sub-line 72-9, and a tenth auxiliary sub-line 72-10.

In an exemplary implementation, a first end of the sixth drive sub-line 52-6 is connected with the touch drive circuit, and a second end of the sixth drive sub-line 52-6 extends toward the second main pad 12 to connect with a functional solder joint 3-3 in a third row and a third column on the second main pad 12. A first end of the sixth auxiliary sub-line 72-6 is connected with the sixth drive sub-line 52-6, and a second end of the sixth auxiliary sub-line 72-6 extends toward the second main pad 12 to connect with a non-functional solder joint 1-1 in a first row and a first column on the second main pad 12. In this way, the sixth drive sub-line is connected with two second solder joints on the second main pad by the sixth auxiliary sub-line, forming the "two-to-one" connection mode.

In an exemplary implementation, a first end of the seventh drive sub-line 52-7 is connected with the touch drive circuit, and a second end of the seventh drive sub-line 52-7 extends toward the second main pad 12 to connect with a functional solder joint 3-5 in the third row and a fifth column on the second main pad 12. A first end of the seventh auxiliary sub-line 72-7 is connected with the seventh drive sub-line 52-7, and a second end of the seventh auxiliary sub-line 72-7 extends toward the second main pad 12 to connect with a non-functional solder joint 1-7 in the first row and a seventh column on the second main pad 12. In this way, the seventh drive sub-line is connected with two second solder joints on the second main pad by the seventh auxiliary sub-line, forming the "two-to-one" connection mode.

In an exemplary implementation, a first end of the eighth drive sub-line 52-8 is connected with the touch drive circuit, and a second end of the eighth drive sub-line 52-8 extends toward the second main pad 12 to connect with a functional solder joint 4-4 in a fourth row and a fourth column on the second main pad 12. A first end of the eighth auxiliary sub-line 72-8 is connected with the eighth drive sub-line 52-8, and a second end of the eighth auxiliary sub-line 72-8 extends toward the second main pad 12 to connect with a non-functional solder joint 3-7 in the third row and the seventh column on the second main pad 12. In this way, the eighth drive sub-line may be connected with two second solder joints on the second main pad by the eighth auxiliary sub-line, forming the "two-to-one" connection mode.

In an exemplary implementation, a first end of the ninth drive sub-line 52-9 is connected with the touch drive circuit, and a second end of the ninth drive sub-line 52-9 extends toward the second main pad 12 to connect with a functional solder joint 5-5 in a fifth row and the fifth column on the second main pad 12. A first end of the ninth auxiliary sub-line 72-9 is connected with the ninth drive sub-line 52-9, and a second end of the ninth auxiliary sub-line 72-9 extends toward the second main pad 12 to connect with a non-functional solder joint 7-7 in a seventh row and the seventh column on the second main pad 12. In this way, the ninth drive sub-line may be connected with two second solder joints on the second main pad by the ninth auxiliary sub-line, forming the "two-to-one" connection mode.

In an exemplary implementation, a first end of the tenth drive sub-line 52-10 is connected with the touch drive circuit, and a second end of the tenth drive sub-line 52-10 extends toward the second main pad 12 to connect with a functional solder joint 5-3 in the fifth row and the third column on the second main pad 12. A first end of the tenth auxiliary sub-line 72-10 is connected with the tenth drive sub-line 52-10, and a second end of the tenth auxiliary sub-line 72-10 extends toward the second main pad 12 to connect with a non-functional solder joint 7-1 in a seventh row and the first column on the second main pad 12. In this way, the tenth drive sub-line may be connected with two second solder joints on the second main pad by the tenth auxiliary sub-line, forming the "two-to-one" connection mode.

In an exemplary embodiment, at least one functional solder joint may be provided between the functional solder joint to which the second drive signal line is connected and the non-functional solder joint to which an auxiliary line connecting the second drive signal line is connected.

In an exemplary embodiment, drive signal lines serving as transmission main lines are connected with the functional solder joints on the pad, and auxiliary lines serving as transmission branch lines are connected with the non-functional solder joints on the pad. Since non-functional solder joints on existing structure pads are usually idle, auxiliary lines can be provided to connect the non-functional solder joints. In the present disclosure, a connection structure in which two solder joints correspond to one signal line by disposing the signal lines to connect the functional solder joints and disposing the auxiliary lines to connect the non-functional solder joints on the main flexible board, thus achieving redundancy of solder joint connection, ensuring signal transmission even if one solder joint has the open NG, and improving reliability of signal transmission through the solder pad.

In an exemplary implementation, each drive sub-line may be provided with n auxiliary sub-lines, and the drive sub-lines may be connected with n+1 solder joints on the pad using the n auxiliary sub-lines to form an "(n+1)-to-one" connection mode, where n is a positive integer greater than 1. For example, if n=1, each drive sub-line can be provided with one auxiliary sub-line, and the drive sub-line can be connected with two solder joints on the pad by the auxiliary sub-line to form the "two-to-one" connection mode. For another example, if n=2, each drive sub-line can be provided with two auxiliary sub-line, and the drive sub-line can be connected with three solder joints on the pad by the two auxiliary sub-line to form a "three-to-one" connection mode.

In an exemplary implementation, a quantity of the auxiliary sub-lines provided on a respective drive sub-line of the plurality of drive sub-lines may be the same or different, which is not limited in the present disclosure.

Figure 12:
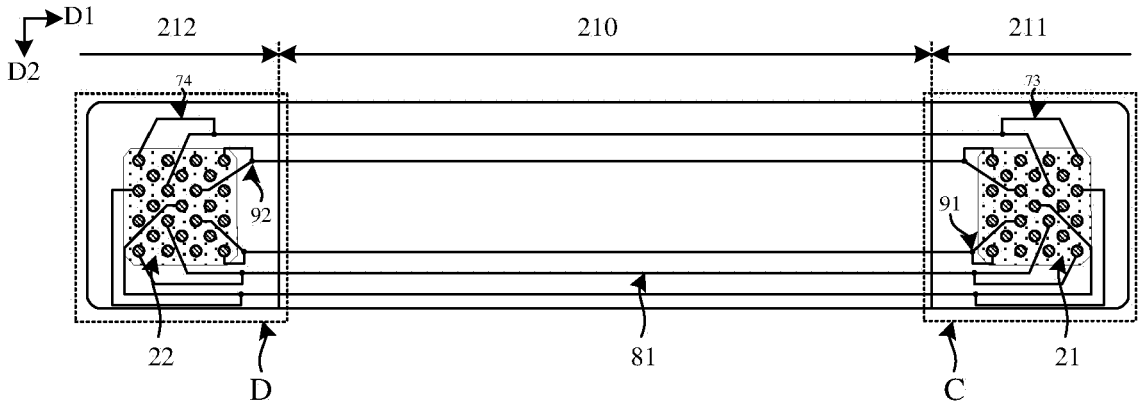
FIG. 12 is a schematic diagram of a planar structure of a bridging flexible board in an exemplary embodiment of the present disclosure.

FIG. 12 is a schematic diagram of a planar structure of a bridging flexible board in a flexible printed circuit board according to an exemplary embodiment of the present disclosure. In an exemplary implementation, the bridging flexible board may include, at least, a first bridging pad 21, a second bridging pad 22 and a plurality of connection lines 81. The first bridging pad 21 may include a plurality of third solder joints, the second bridging pad 22 may include a plurality of fourth solder joints, first ends of the plurality of connection lines 81 are connected to the plurality of third solder joints of the first bridging pad 21, correspondingly, and second ends of the plurality of connection lines 81 are connected to the plurality of fourth solder joints of the second bridging pad 22, correspondingly.

In an exemplary implementation, the third solder joints in the first bridging pads 21 may be arranged in an arrangement shown in FIG. 9*a*, and includes 25 solder joints which may be in an arrangement of 7 rows and 7 columns to form a solder joint array.

In an exemplary implementation, the bridging flexible board may further include at least one third auxiliary line 73 and at least one fourth auxiliary line 74. A first end of the third auxiliary line 73 is connected with the connection line 81, and a second end of the third auxiliary line 73 is connected with the third solder joint of the first bridging pad 21. A first end of the fourth auxiliary line 74 is connected to the connection line 81, and a second end of the third auxiliary line 73 is connected to a fourth solder joint of the second bridging pad 22.

In an exemplary implementation, the plurality of third solder joints may include at least one third functional solder joint located inside the solder joint array and at least one third non-functional solder joint located outside the solder joint array, and the plurality of fourth solder joints may include at least one fourth functional solder joint located inside the solder joint array and at least one fourth non-functional solder joint located outside the solder joint array. A first end of the connection line 81 is connected to a third functional solder joint of the first bridging pad 21, and a second end of the connection line 81 is connected to a fourth functional solder joint of the second bridging pad 22. The first end of the third auxiliary line 73 is connected with the connection line 81, and the second end of the third auxiliary line 73 is connected with at least one third non-functional solder joint of the first bridging pad 21. The first end of the fourth auxiliary line 74 is connected to the connection line 81, and a second end of the fourth auxiliary line 74 is connected to a fourth non-functional solder joint of the second bridging pad 22.

Figure 13:
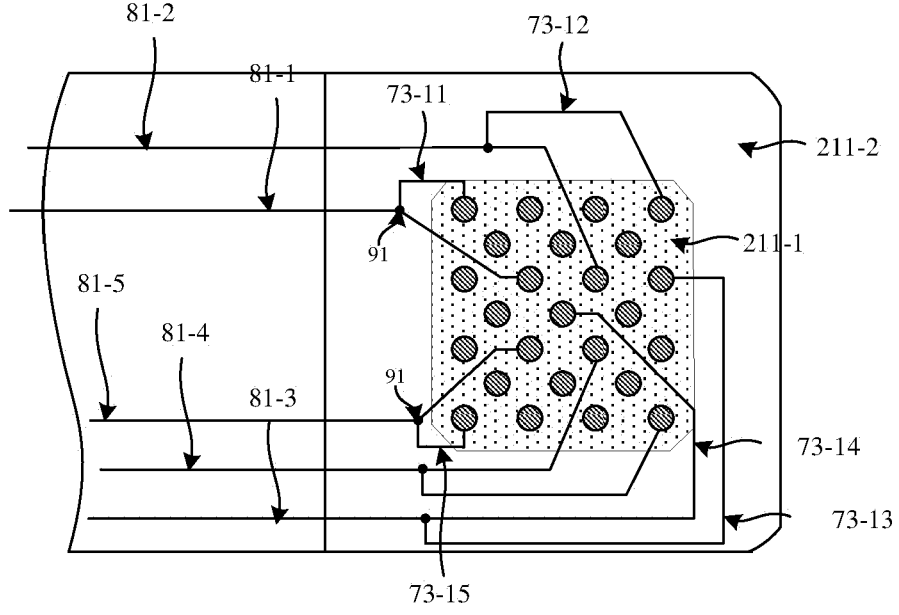
FIG. 13 is an enlarged view of a region C in FIG. 12.
Figure 14:
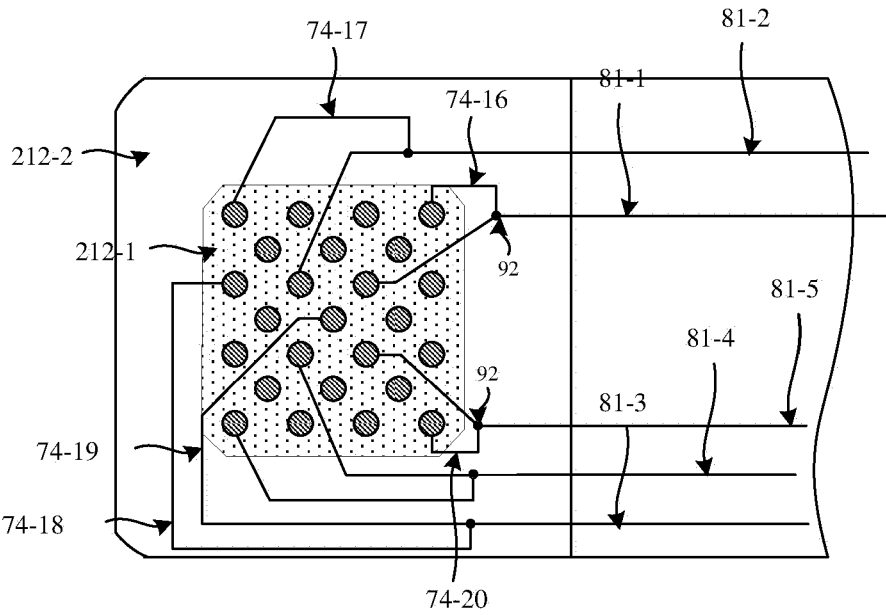
FIG. 14 is an enlarged view of a region D in FIG. 12.

FIG. 13 is an enlarged view of a region C in FIG. 12, and FIG. 14 is an enlarged view of a region D in FIG. 12. Connection of the connection lines to the third solder joint and the fourth solder joint will be described in detail by taking five connection lines, the first bridging pad having the structure shown in FIG. 9a and the second bridging pad having the structure shown in FIG. 9b as examples. As shown in FIGS. 13 and 14, the five connection lines may include a first connecting sub-line 81-1, a second connecting sub-line 81-2, a third connecting sub-line 81-3, a fourth connecting sub-line 81-4, and a fifth connecting sub-line 81-5. There are five third auxiliary lines, which may include an eleventh auxiliary sub-line 73-11, a twelfth auxiliary sub-line 73-12, a thirteenth auxiliary sub-line 73-13, a fourteenth auxiliary sub-line 73-14, and a fifteenth auxiliary sub-line 73-15. There are five fourth auxiliary lines, which may include a sixteenth auxiliary sub-line 74-16, a seventeenth auxiliary sub-line 74-17, an eighteenth auxiliary sub-line 74-18, a nineteenth auxiliary sub-line 74-19, and a twentieth auxiliary sub-line 74-20.

In an exemplary implementation, a first end of the first connection sub-line 81-1 is connected with a functional solder joint 3-3 in a third row and a third column on the first bridging pad 21, and a second end of the first connection sub-line 81-1 is connected with a functional solder joint 3-3 in a third row and a third column on the second bridging pad 22. A first end of the eleventh auxiliary sub-line 73-11 is connected with the first connection sub-line 81-1, and a second end of the eleventh auxiliary sub-line 73-11 extends toward the first bridging pad 21 to connect to a non-functional solder joint 1-1 in a first row and a first column on the first bridging pad 21. A first end of the sixteenth auxiliary sub-line 74-16 is connected with the first connection sub-line 81-1, and a second end of the sixteenth auxiliary sub-line 74-16 extends toward the second bridging pad 22 to connect to a non-functional solder joint 1-1 in a first row and a first column on the second bridging pad 22. In this way, the first end of the first connection sub-line can be connected with two third solder joints on the first bridging pad by the eleventh auxiliary sub-line to form the "two-to-one" connection mode, and the second end of the first connection sub-line can be connected with two fourth solder joints on the second bridging pad by the sixteenth auxiliary sub-line to form the "two-to-one" connection mode.

In an exemplary implementation, a first end of the second connection sub-line 81-2 is connected with a functional solder joint 3-5 in the third row and a fifth column on the first bridging pad 21, and a second end of the second connection sub-line 81-2 is connected with a functional solder joint 3-5 in the third row and a fifth column on the second bridging pad 22. A first end of the twelfth auxiliary sub-line 73-12 is connected with the second connection sub-line 81-2, and a second end of the twelfth auxiliary sub-line 73-12 extends toward the first bridging pad 21 to connect with a non-functional solder joint 1-7 in the first row and a seventh column on the first bridging pad 21. A first end of the seventeenth auxiliary sub-line 74-17 is connected with the second connection sub-line 81-2, and a second end of the seventeenth auxiliary sub-line 74-17 extends toward the second bridging pad 22 to connect with a non-functional solder joint 1-7 in the first row and the seventh column on the second bridging pad 22. In this way, the first end of the second connection sub-line can be connected with the two third solder joints on the first bridging pad by the twelfth auxiliary sub-line, forming the "two-to-one" connection mode. The second end of the second connection sub-line can be connected with the two fourth solder joints on the second bridging pad by the seventeenth auxiliary sub-line to form the "two-to-one" connection mode.

In an exemplary implementation, a first end of the third connection sub-line 81-3 is connected with a functional solder joint 4-4 in a fourth row and a fourth column on the first bridging pad 21, and a second end of the third connection sub-line 81-3 is connected with a functional solder joint 4-4 in a fourth row and a fourth column on the second bridging pad 22. A first end of the thirteenth auxiliary sub-line 73-13 is connected with the third connection sub-line 81-3, and a second end of the thirteenth auxiliary sub-line 73-13 extends toward the first bridging pad 21 to connect with a non-functional solder joints 3-7 in a third row and the seventh column on the first bridging pad 21. A first end of the eighteenth auxiliary sub-line 74-18 is connected with the third connection sub-line 81-3, and a second end of the eighteenth auxiliary sub-line 74-18 extends toward the second bridging pad 22 to connect to a non-functional solder joints 3-7 in a third row and the seventh column on the second bridging pad 22. In this way, the first end of the third connection sub-line can be connected with the two third solder joints on the first bridging pad by the thirteenth auxiliary sub-line, forming the "two-to-one" connection mode. A second end of the third connection sub-line 81-3 can be connected with the two fourth solder joints on the second bridging pad by the eighteenth auxiliary sub-line, forming the "two-to-one" connection mode.

In an exemplary implementation, a first end of the fourth connection sub-line 81-4 is connected with a functional solder joint 5-5 in a fifth row and the fifth column on the first bridging pad 21, and a second end of the fourth connection sub-line 81-4 is connected with a functional solder joint 5-5 in a fifth row and the fifth column on the second bridging pad 22. A first end of the fourteenth auxiliary sub-line 73-14 is connected with the fourth connection sub-line 81-4, and a second end of the fourteenth auxiliary sub-line 73-14 extends toward the first bridging pad 21 to connect with a non-functional solder joint 7-7 in a seventh row and the seventh column on the first bridging pad 21. A first end of the nineteenth auxiliary sub-line 74-19 is connected with the fourth connection sub-line 81-4, and a second end of the nineteenth auxiliary sub-line 74-19 extends toward the second bridging pad 22 to connect with a non-functional solder joint 7-7 in a seventh row and the seventh column on the second bridging pad 22. In this way, the first end of the fourth connection sub-line can be connected with the two third solder joints on the first bridging pad by the fourteenth auxiliary sub-line, forming the "two-to-one" connection mode. The second end of the fourth connection sub-line can be connected with the two fourth solder joints on the second bridging pad by the nineteenth auxiliary sub-line to form the "two-to-one" connection mode.

In an exemplary implementation, a first end of the fifth connection sub-line 81-5 is connected with a functional solder joint 5-3 in the fifth row and the third column on the first bridging pad 21, and a second end of the fifth connection sub-line 81-5 is connected with a functional solder joint 5-3 in the fifth row and the third column on the second bridging pad 22. A first end of the fifteenth auxiliary sub-line 73-15 is connected with the fifth connection sub-line 81-5, and a second end of the fifteenth auxiliary sub-line 73-15 extends toward the first bridging pad 21 to connect with a non-functional solder joint 7-1 in the seventh row and the first column on the first bridging pad 21. A first end of the twentieth auxiliary sub-line 74-20 is connected with the fifth connection sub-line 81-5, and a second end of the twentieth auxiliary sub-line 74-20 extends toward the second bridging pad 22 to connect with a non-functional solder joint 7-1 in the seventh row and the first column on the second bridging pad 22. In this way, the first end of the fifth connection sub-line can be connected with the two third solder joints on the first bridging pad by the fifteenth auxiliary sub-line, forming the "two-to-one" connection mode. A second end of the fifth connection sub-line 81-5 can be connected with the two fourth solder joints on the second bridging pad by the twentieth auxiliary sub-line, forming the "two-to-one" connection mode.

In an exemplary embodiment, at least one functional solder joint may be provided between the functional solder joint to which the connection line is connected and the non-functional solder joint to which an auxiliary line connecting the connection line is connected.

In an exemplary embodiment, connection lines serving as transmission main lines are connected with the functional solder joints on the pad, and auxiliary lines serving as branch lines are connected with the non-functional solder joints on the pad. Since non-functional solder joints on existing structure pads are usually idle, auxiliary lines can be provided to connect the non-functional solder joints. In the present disclosure, a connection structure in which two solder joints correspond to one connection line by disposing the connection lines to connect the functional solder joints and disposing the auxiliary lines to connect the non-functional solder joints on the bridging flexible board, thus achieving redundancy of solder joint connection, ensuring signal transmission even if one solder joint has the open NG, and improving reliability of signal transmission through the solder pad.

In an exemplary implementation, each connection sub-line may be provided with n auxiliary sub-lines, and the drive sub-lines may be connected with n+1 solder joints on the pad using the n auxiliary sub-lines to form an "(n+1)-to-one" connection mode, where n is a positive integer greater than 1. For example, if n=1, each connection sub-line can be provided with one auxiliary sub-line, and the connection sub-line can be connected with two solder joints on the pad by the auxiliary sub-line to form the "two-to-one" connection mode. For another example, if n=2, each connection sub-line can be provided with two auxiliary sub-line, and the connection sub-line can be connected with three solder joints on the pad by the two auxiliary sub-line to form a "three-to-one" connection mode.

In an exemplary implementation, a quantity of the auxiliary sub-lines provided on a respective connection sub-line of the plurality of connection sub-lines may be the same or different, which is not limited in the present disclosure.

In a double-layer bridging flexible printed circuit board, a signal line is usually connected to a functional solder joint of the main pad, and a connection line is connected to a functional solder joint of the bridging pad. The functional solder joint of the bridging pad is soldered with the functional solder joint of the main pad to connect the signal lines on the main flexible board through the bridging flexible board. For example, a connection relationship between the first drive signal line and the second drive signal line on the main flexible board is as follows: the first drive signal line is connected with the solder joint 3-3 on the first main pad, the solder joint 3-3 on the first main pad is connected with the solder joint 3-3 on the first bridging pad, the solder joint 3-3 on the first bridging pad is connected with the first end of the connection line, the second end of the connection line is connected with the solder joint 3-3 on the second bridging pad, the solder joint 3-3 on the second bridging pad is connected with the solder joint 3-3 on the second main pad, and the solder joint 3-3 on the second main pad is connected with the second drive signal line.

The present disclosure provides a flexible printed circuit board, wherein at least one signal line is connected with a functional solder joint of the main pad, at least one auxiliary line connected with the signal line is connected with the non-functional solder joint of the main pad, at least one connection line is connected to the functional solder joint of the bridging pad, and at least one auxiliary line connected to the connection line is connected with the non-functional solder joint of the bridging pad. The functional solder joints and non-functional solder joints of the bridging pad are soldered correspondingly with the functional solder joints and the non-functional solder joints of the main pad, such that not only the signal lines on the main flexible board are connected through the bridging flexible board, but also each signal line has at least two solder joint connection channels between the main pad and the bridging pad. For example, a connection relationship between the first drive signal line and the second drive signal line on the main flexible board is that the first drive signal line is connected with the solder joint 3-3 on the first main pad, and the auxiliary line of the first drive signal line is connected with the solder joint 1-1 on the first main pad. The Solder joint 3-3 on the first main pad is connected with the solder joint 3-3 on the first bridging pad, and the solder joint 1-1 on the first main pad is connected with the solder joint 1-1 on the first bridging pad. The Solder joint 3-3 on the first bridging pad is connected with the first end of the connection line, and the solder joint 1-1 on the first bridging pad is connected with the auxiliary line of the connection line. The second end of the connection line is connected with the solder joint 3-3 on the second bridging pad, and the auxiliary line of the connection line is connected with the solder joint 1-1 on the second bridging pad. The Solder joint 3-3 on the second bridging pad is connected with the solder joint 3-3 on the second main pad, and the solder joint 1-1 on the second bridging pad is connected with the solder joint 1-1 on the second main pad. The solder joint 3-3 on the second main pad is connected with the second drive signal line, and the solder joint 1-1 on the second main pad is connected with the auxiliary line of the second drive signal line. In the present disclosure, at least two solder joint connection channels are arranged between the main solder pad and the bridge solder pad, thus achieving redundancy of solder joint connection, ensuring signal transmission even if one solder joint has the open NG, and improving the reliability of signal transmission through the solder pad.

As shown in FIGS. 12 to 14, in an exemplary implementation, the bridging flexible board may include a connection line region 210, a first pad region 211, and a second pad region 212, wherein the connection line region 210 may be disposed between the first pad region 211 and the second pad region 212.

In an exemplary implementation, the connection line region 210 may be provided with a plurality of connection lines 81, a shape of which may be a straight line or a polygonal line extending along the first direction D1, and the plurality of connection Lines 81 may be provided in sequence in the second direction D2. First ends of the plurality of connection lines 81 extend to the first pad region 211 to connect with the plurality of third solder joints, correspondingly, and second ends of the plurality of connection lines 81 extend to the second pad region 212 to connect with the plurality of fourth solder joints, correspondingly.

In an exemplary implementation, the first pad region 211 may include a first solder joint region 211-1 configured to provide a first bridging pad, and a first glue dispensing region 211-2 which may be provided at a periphery of the first solder joint region 211-1, glue dispensing is performed on a surface of the first glue dispensing region 211-2 by a dispensing machine to form a glue dispensing layer within the first glue dispensing region 211-2.

In an exemplary implementation, the second pad region 212 may include a second solder joint region 212-1 configured to provide a second bridging pad, and a second glue dispensing region 212-2 which may be provided at a periphery of the second solder joint region 212-1, glue dispensing is performed on a surface of the second glue dispensing region 212-2 by a dispensing machine to form a glue dispensing layer within the second glue dispensing region 212-2.

In an exemplary implementation, the first solder joint region 211-1 and the second solder joint region 212-1 may be referred to as Ball Grid Array (BGA) regions.

In an exemplary implementation, a first connection point 91 where the third auxiliary line 73 is connected with the connection line 81 may be located in the first glue dispensing region 211-2. Because the first glue dispensing region is provided with a glue dispensing layer, the first glue dispensing region is not prone to deformation. In the present disclosure, by disposing the first connection point in the first glue dispensing region, the deformation affecting the third connection point can be avoided and connection reliability is improved.

In an exemplary implementation, a second connection point 92 where the fourth auxiliary line 74 is connected with the connection line 81 may be located in the second glue dispensing region 212-2. Because the second glue dispensing region is provided with a glue dispensing layer, the second glue dispensing region is not prone to deformation. In the present disclosure, by disposing the second connection point in the second glue dispensing region, the deformation affecting the second connection point can be avoided and connection reliability is improved.

Figure 15:
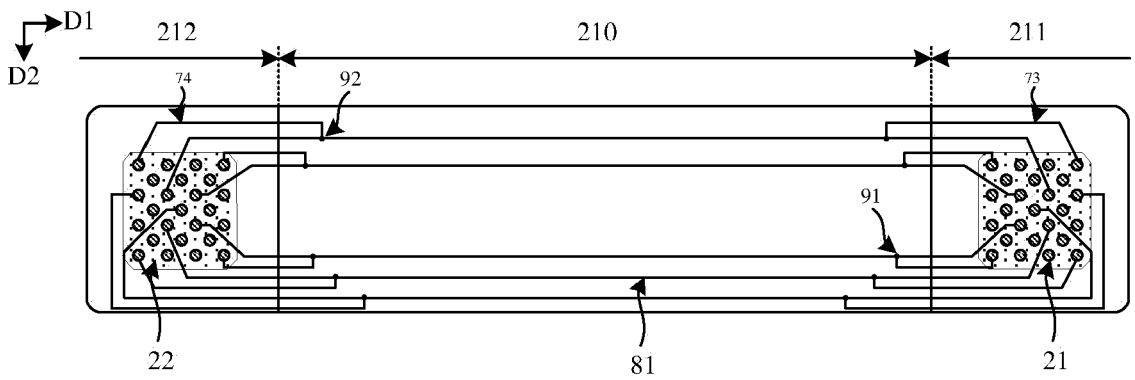
FIG. 15 is a schematic diagram of a planar structure of another bridging flexible board in an exemplary embodiment of the present disclosure.

FIG. 15 is a schematic diagram of a planar structure of another bridging flexible board in a flexible printed circuit board according to an exemplary embodiment of the present disclosure. In the exemplary implementation, a structure of the bridging flexible board in the exemplary embodiment is substantially similar to the structure of the bridging flexible board shown in FIG. 12, except that the first connection point 91 where the third auxiliary line 73 is connected with the connection line 81 may be located in the connection line region 210, and the second connection point 92 where the fourth auxiliary line 74 is connected with the connection line 81 may be located in the connection line region 210.

In an exemplary implementation, since the connection line region is away from the BGA region, the surface of the connection line region is relatively flat. In the present disclosure, by disposing the first connection point and the second connection point in the connection line region, deformation affecting the first connection point and the second connection point can be avoided, and connection reliability can be improved.

FIG. 16 is a schematic diagram of a planar structure of yet another bridging flexible board in a flexible printed circuit board in an exemplary embodiment of the present disclosure, illustrating a structure of a first pad region 211 and a part of a connection line region 210. As shown in FIG. 16, in an exemplary implementation, the structure of the bridging flexible board in the exemplary embodiment is substantially similar to the structure of the bridging flexible board shown in FIG. 12, except that at least one through hole 90 is also provided on the bridging flexible board.

In an exemplary implementation, the through hole 90 may be disposed in the first pad region and/or may be disposed in the BGA region of the second pad region.

In an exemplary implementation, the through hole 90 may be located between adjacent third solder joints and/or may be located between adjacent fourth solder joints.

In an exemplary implementation, a shape of the through hole 90 may include any one or more of the following: triangle, square, rectangle, diamond, parallelogram, trapezoid, pentagon, hexagon, which is not limited in the present disclosure.

In an exemplary implementation, a dimension of the through hole 90 is less than or equal to 0.1 mm, and the dimension of the through hole refers to a maximum distance between any two points on an edge of the through hole. For example, when the shape of the through hole is circular, a diameter of the through hole may be about 0.05 mm, 0.08 mm, 0.1 mm or the like.

In an exemplary implementation, a second center distance L2 between the through hole 90 and an adjacent third solder joint may be about 0.55 mm to 0.65 mm, and/or a second center distance L2 between the through hole 90 and an adjacent fourth solder joint may be about 0.55 mm to 0.65 mm, wherein the second center distance L2 is a distance between a geometric center of the through hole and a geometric center of a solder joint.

In an exemplary implementation, an adjacent third solder joint or an adjacent fourth solder joint may be adjacent in the first direction D1 or may be adjacent in the second direction D2.

FIG. 17 is a schematic diagram of a cross-sectional structure of a flexible circuit board according to an exemplary embodiment of the present disclosure, which is a sectional view taken along an A-A direction in FIG. 16. As shown in FIG. 17, a bridging flexible board 20 is disposed on the main flexible board 10 in a plane perpendicular to the flexible circuit board. The bridging flexible board 20 may include a bridging shielding layer 420 disposed on the main flexible board 10, a first bridging soldermask layer 421 disposed on a side of the bridging shielding layer 420 away from the main flexible board 10, a first bridging conductive layer 422 disposed on a side of the first bridging soldermask layer 421 away from the main flexible board 10, a bridging substrate layer 423 disposed on a side of the first bridging conductive layer 422 away from the main flexible board 10, a second bridging conductive layer 424 disposed on a side of the bridging substrate layer 423 away from the main flexible board 10, and a second bridging soldermask layer 425 disposed on a side of the second bridging conductive layer 424 away from the main flexible board 10.

In an exemplary implementation, the first pad region 211 (or the second pad region 212) is provided with a plurality of solder joint vias, the bridging shielding layer 420, the first bridging soldermask layer 421, the first bridging conductive layer 422, the bridging substrate layer 423, the second bridging conductive layer 424, and the second bridging soldermask layer 425 within the solder joint vias are removed, and the solder joint vias are configured to receive solder 93 to form solder joints for connecting the bridging flexible board 20 to the main flexible board 10.

In an exemplary implementation, the first pad region 211 (or the second pad region 212) may be provided with at least one through hole 90, which may be located between the solder joint vias, and the bridging shielding layer 420, the first bridging soldermask layer 421, the first bridging conductive layer 422, the bridging substrate layer 423, the second bridging conductive layer 424, and the second bridging soldermask layer 425 within the through hole 90 are removed. In the exemplary implementation, the through hole 90 is configured as a gas flow channel to exhaust gas between the solder 93 when performing vacuum reflux soldering, thereby improving exhaust efficiency during reflux soldering, reducing bubbles within and between the solder, and reducing occurrence of virtual soldering.

In an exemplary implementation, the first bridging conductive layer 422 may be referred to as a ground copper layer and the second bridging conductive layer 424 may be referred to as a trace layer.

In an exemplary implementation, the main flexible board 10 may include an outer shielding layer 411, a covering layer 412 disposed on the outer shielding layer 411, a first main conductive layer 413 disposed on a side of the covering layer 412 away from the outer shielding layer 411, a main substrate layer 414 disposed on a side of the first main conductive layer 413 away from the outer shielding layer 411, a second main conductive layer 415 disposed on a side of the main substrate layer 414 away from the outer shielding layer 411, a main soldermask layer 416 disposed on a side of the second main conductive layer 415 away from the outer shielding layer 411, and a main shielding layer 417 disposed on a side of the main soldermask layer 416 away from the outer shielding layer 411. In an exemplary implementation, a plurality of main board vias are provided on the main shielding layer 417 and the main soldermask layer 416, the main shielding layer 417 and the main soldermask layer 416 in the main board vias are removed, and positions of the main board vias correspond to positions of the solder joint vias on the bridging flexible board 20, which may expose the second main conductive layer 415 so that the solder 93 filled in the solder joint vias connects the bridging flexible board 20 with the main flexible board 10.

FIG. 18 is a schematic diagram of a cross-sectional structure of another flexible circuit board according to an exemplary embodiment of the present disclosure, which is a sectional view taken along an A-A direction in FIG. 16. As shown in FIG. 18, a main structure of the flexible circuit board in the exemplary embodiment is substantially similar to the structure shown in FIG. 17, except that the bridging shielding layer of the bridging flexible board is removed and the main shielding layer of the main flexible board is removed.

In an exemplary implementation, the bridging flexible board 20 may include a first bridging soldermask layer 421 disposed on the main flexible board 10, a first bridging conductive layer 422 disposed on a side of the first bridging soldermask layer 421 away from the main flexible board 10, a bridging substrate layer 423 disposed on a side of the first bridging conductive layer 422 away from the main flexible board 10, a second bridging conductive layer 424 disposed on a side of the bridging substrate layer 423 away from the main flexible board 10, and a second bridging soldermask layer 425 disposed on a side of the second bridging conductive layer 424 away from the main flexible board 10.

In an exemplary implementation, the main flexible board 10 may include an outer shielding layer 411, a covering layer 412 disposed on the outer shielding layer 411, a first main conductive layer 413 disposed on a side of the covering layer 412 away from the outer shielding layer 411, a main substrate layer 414 disposed on a side of the first main conductive layer 413 away from the outer shielding layer 411, a second main conductive layer 415 disposed on a side of the main substrate layer 414 away from the outer shielding layer 411, and a main soldermask layer 416 disposed on a side of the second main conductive layer 415 away from the outer shielding layer 411.

In an exemplary implementation, the first pad region 211 (or the second pad region 212) is provided with a plurality of solder joint vias, and the first pad region 211 (or the second pad region 212) may be provided with at least one via 90.

In a flexible circuit board structure, a main flexible board usually includes a main shielding film disposed on a side of a main soldermask layer away from an outer shielding layer, and a bridging flexible board usually includes a bridge shielding film disposed on a side of a first bridging soldermask layer close to the main flexible board, forming a structure in which the bridge shielding film is in contact with the main shielding film. According to the flexible circuit board provided in the exemplary embodiment, the main shielding film of the main flexible board and the bridging shielding film of the bridging flexible board are removed to form a structure in which the main soldermask layer of the main flexible board and the first bridging soldermask layer of the bridging flexible board are in direct contact. In this way, not only an overall thickness of the flexible circuit board can be reduced, but also the deformation caused by a cohesive force pulling of the shielding film can be prevented, a surface flatness is improved and a bonding degree of the main flexible board and the bridging flexible board is improved. Compared with existing flexible circuit board structures, the overall thickness of the flexible circuit board in the exemplary embodiment after removing the main shielding film and the bridge shielding film can be reduced by about 12 μm to 20 μm. Since there is no functional connection between the main flexible board and the bridging flexible board except for the first pad region and the second pad region, removal of the main shielding film and the bridge shielding film does not affect a shielding function.

FIG. 19 is a schematic diagram of a cross-sectional structure of yet another flexible circuit board according to an exemplary embodiment of the present disclosure, which is a sectional view taken along an A-A direction in FIG. 16. As shown in FIG. 19, a main structure of the flexible printed circuit board in the exemplary embodiment is substantially similar to the structure shown in FIG. 17 except that the ground copper layer of the first pad region 211 (or the second pad region 212) is removed.

In an exemplary embodiment, the bridging flexible board 20 may include a bridging shielding layer 420 disposed on the main flexible board 10, a first bridging soldermask layer 421 disposed on a side of the bridging shielding layer 420 away from the main flexible board 10, a first bridging conductive layer 422 disposed on a side of the first bridging soldermask layer 421 away from the main flexible board 10, a bridging substrate layer 423 disposed on a side of the first bridging conductive layer 422 away from the main flexible board 10, a second bridging conductive layer 424 disposed on a side of the bridging substrate layer 423 away from the main flexible board 10, and a second bridging soldermask layer 425 disposed on a side of the second bridging conductive layer 424 away from the main flexible board 10.

In an exemplary implementation, the first bridging conductive layer 422 is provided only in the connection line region 210, and the first bridging conductive layer 422 of the first pad region 211 (or the second pad region 212) is removed, leaving only a via copper ring at the solder joint via, wherein the via copper ring is configured to ensure connection reliability between the bridging flexible board 20 and the main flexible board 10.

In an exemplary implementation, a distance L3 between a solder joint in the first pad region 211 (or the second pad region 212) on a side close to the connection line region 210 and an edge of the first bridging conductive layer 422 on a side close to the solder joint in the connection line region 210 may be greater than or equal to 1.0 mm to reduce a segment difference near the first pad region 211 (or the second pad region 212) and improve the surface flatness of the region.

In an exemplary implementation, the first pad region 211 (or the second pad region 212) is provided with a plurality of solder joint vias, the first pad region 211 (or the second pad region 212) may be provided with at least one through hole 90, and the structure of the main flexible board is substantially the same as the structure of the main flexible board shown in FIG. 17.

In a flexible circuit board structure, an opening is usually provided in the pad region, the ground copper layer in the opening is removed, the ground copper layer outside the opening is retained, and a plurality of solder joints are provided in the ground copper opening, and a minimum distance between each of the solder joints and an edge of the ground copper opening is about 0.3 mm. According to the research of the inventor of the present application, because the pad region still retains a large area of ground copper layer, a spacing between solder joints is small, and the pad region is prone to deformation during reflux soldering. In the exemplary embodiment, by removing the ground copper layer in the solder pad region, the area of the solder pad region and the spacing between the solder pads are increased. In this way, not only the deformation risk of the solder pad region can be reduced, but also through holes between the solder pads can be provided, thereby improving exhaust efficiency during reflux soldering, reducing bubbles within and between the solder, and reducing occurrence of virtual soldering. Compared with existing flexible circuit board structures, the flexible circuit board in the exemplary embodiment improves the soldering reliability, reduces the defection risk and improves the product yield. In addition, in the exemplary embodiment, the overall thickness of the flexible circuit board is effectively reduced by about 8 μm to about 12 μm by removing the ground copper layer in the pad region compared with existing flexible circuit board structures.

FIG. 20 is a schematic diagram of a cross-sectional structure of yet another bridging flexible board according to an exemplary embodiment of the present disclosure, which is a sectional view taken along an A-A direction in FIG. 16. As shown in FIG. 20, a main structure of the flexible circuit board in the exemplary embodiment is substantially similar to the structure shown in FIG. 17, except that the bridging shielding layer of the bridging flexible board is removed, the main shielding layer of the main flexible board is removed, and the ground copper layer of the first pad region 211 (or the second pad region 212) is removed.

In an exemplary implementation, the bridging flexible board 20 may include a first bridging soldermask layer 421 disposed on the main flexible board 10, a first bridging conductive layer 422 disposed on a side of the first bridging soldermask layer 421 away from the main flexible board 10, a bridging substrate layer 423 disposed on a side of the first bridging conductive layer 422 away from the main flexible board 10, a second bridging conductive layer 424 disposed on a side of the bridging substrate layer 423 away from the main flexible board 10, and a second bridging soldermask layer 425 disposed on a side of the second bridging conductive layer 424 away from the main flexible board 10.

In an exemplary implementation, the main flexible board 10 may include an outer shielding layer 411, a covering layer 412 disposed on the outer shielding layer 411, a first main conductive layer 413 disposed on a side of the covering layer 412 away from the outer shielding layer 411, a main substrate layer 414 disposed on a side of the first main conductive layer 413 away from the outer shielding layer 411, a second main conductive layer 415 disposed on a side of the main substrate layer 414 away from the outer shielding layer 411, and a main soldermask layer 416 disposed on a side of the second main conductive layer 415 away from the outer shielding layer 411. In an exemplary implementation, a plurality of soldermask vias are provided on the main soldermask layer 416, the main soldermask layer 416 in the soldermask vias is removed, and positions of the soldermask vias correspond to positions of the solder joint vias on the bridging flexible board 20, which may expose the second main conductive layer 415 so that the solder 93 filled in the solder joint vias connects the bridging flexible board 20 with the main flexible board 10.

In an exemplary implementation, the first pad region 211 (or the second pad region 212) is provided with a plurality of solder joint vias, the first bridging soldermask layer 421, the first bridging conductive layer 422, the bridging substrate layer 423, the second bridging conductive layer 424, and the second bridging soldermask layer 425 within the solder joint vias are removed, and the solder joint vias are configured to receive solder 93 to form solder joints for connecting the bridging flexible board 20 to the main flexible board 10.

In an exemplary implementation, the first pad region 211 (or the second pad region 212) may be provided with at least one through hole 90 which may be located between the solder joint vias. In the exemplary implementation, the through hole 90 is configured as a gas flow channel to exhaust gas between the solder 93 when performing vacuum reflux soldering, thereby improving exhaust efficiency during reflux soldering, reducing bubbles within and between the solder, and reducing occurrence of virtual soldering.

In an exemplary implementation, the first bridging conductive layer 422 is provided only in the connection line region 210, and the first bridging conductive layer 422 of the first pad region 211 (or the second pad region 212) is removed, leaving only a via copper ring at the solder joint via, wherein the via copper ring is configured to ensure connection reliability between the bridging flexible board 20 and the main flexible board 10.

In an exemplary implementation, a distance L3 between a solder joint in the first pad region 211 (or the second pad region 212) on a side close to the connection line region 210 and an edge of the first bridging conductive layer 422 on a side close to the solder joint in the connection line region 210 may be greater than or equal to 1.0 mm to reduce a segment difference near the first pad region 211 (or the second pad region 212) and improve the surface flatness of the region.

In the exemplary embodiment, by removing the ground copper layer in the solder pad region, the area of the solder pad region and the spacing between the solder pads are increased. In this way, not only the deformation risk of the solder pad region can be reduced, but also through holes between the solder pads can be provided, thereby improving exhaust efficiency during reflux soldering, reducing bubbles within and between the solder, and reducing occurrence of virtual soldering. Compared with existing flexible circuit board structures, the flexible circuit board in the exemplary embodiment improves the soldering reliability, reduces the defection risk and improves the product yield. In addition, in the present exemplary embodiment, the overall thickness of the flexible circuit board is minimized by removing the main shielding film of the main flexible board and the bridge shielding film of the bridging flexible board, and removing the ground copper layer in the pad region. Compared with the existing flexible circuit board structure, the overall thickness of the flexible circuit board in the exemplary embodiment can be reduced by about 20 μm to about 32 μm.

A touch-control display apparatus is also provided in an exemplary embodiment of the present disclosure. The touch-control display apparatus includes a touch display panel and the aforementioned flexible printed circuit board, wherein the touch display panel may include an effective region and a binding region located on a side of the effective region, the binding region may include a binding pin region, and the flexible printed circuit board are connected with the binding pin region.

In an exemplary implementation, the touch-control display apparatus in the present disclosure may be any product or component with a display function such as a mobile phone, a tablet computer, a television, a display, a laptop computer, a digital cinema, a digital photo frame, or a navigator, etc.

Although the implementations disclosed in the present disclosure are described as above, the described contents are only implementations which are used for facilitating the understanding of the present disclosure, and are not intended to limit the present invention. Any skilled person in the art to which the present disclosure pertains may make any modifications and variations in forms and details of implementations without departing from the spirit and scope of the present disclosure. However, the patent protection scope of the present invention should be subject to the scope defined by the appended claims.

The invention claimed is:

1. A flexible printed circuit board including a main flexible board and a bridging flexible board, wherein the main flexible board comprises, at least, a first main pad, a second main pad, at least one first signal line and at least one second signal line, and the bridging flexible board comprises, at least, a first bridging pad, a second bridging pad and at least one connection line;

the first main pad comprises at least two first solder joints, the second main pad comprises at least two second solder joints, the first signal line is connected with one first solder joint, and the second signal line is connected with one second solder joint;

the first bridging pad comprises at least two third solder joints, the second bridging pad comprises at least two fourth solder joints, a first end of the connection line is connected with a third solder joint, and a second end of the connection line is connected with a fourth solder joint;

the first solder joint is connected with the third solder joint by solder, and the second solder joint is connected with the fourth solder joint by solder;

the flexible printed circuit board further comprises any one or more of a first auxiliary line, a second auxiliary line, a third auxiliary line, and a fourth auxiliary line;

a first end of the first auxiliary line is connected with the first signal line, and a second end of the first auxiliary line is connected with another first solder joint;

a first end of the second auxiliary line is connected with the second signal line, and a second end of the second auxiliary line is connected with another second solder joint;

a first end of the third auxiliary line is connected with the connection line, and a second end of the third auxiliary line is connected with another third solder joint; and a first end of the fourth auxiliary line is connected with the connection line, and a second end of the fourth auxiliary line is connected with another fourth solder joint.

2. The flexible printed circuit board of claim 1, wherein the main flexible board comprises a touch drive circuit and at least one terminal, a first end of the first signal line is connected to the terminal, a second end of the first signal line is connected to the first solder joint of the first main pad, a first end of the second signal line is connected to the touch drive circuit, and a second end of the second signal line is connected to a second solder joint of the second main pad.

3. The flexible printed circuit board of claim 1, wherein the first main pad comprises a plurality of first solder joints arranged in a matrix manner in a solder joint array, wherein the plurality of first solder joints comprise at least one first functional solder joint located inside the solder joint array and at least one first non-functional solder joint located outside the solder joint array, the first signal line is connected with the first functional solder joint, and the first auxiliary line is connected with the first non-functional solder joint.

4. The flexible printed circuit board of claim 1, wherein the second main pad comprises a plurality of second solder joints arranged in a matrix manner in a solder joint array, wherein the plurality of second solder joints comprise at least one second functional solder joint located inside the solder joint array and at least one second non-functional solder joint located outside the solder joint array, the second signal line is connected with the second functional solder joint, and the second auxiliary line is connected with the second non-functional solder joint.

5. The flexible printed circuit board of claim 1, wherein the first bridging pad comprises a plurality of third solder joints arranged in a matrix manner in a solder joint array, wherein the plurality of third solder joints comprise at least one third functional solder joint located inside the solder joint array and at least one third non-functional solder joint located outside the solder joint array, the connection line is connected with the third functional solder joint, and the third auxiliary line is connected with the third non-functional solder joint.

6. The flexible printed circuit board of claim 1, wherein the second bridging pad comprises a plurality of fourth solder joints arranged in a matrix manner in a solder joint array, wherein the plurality of fourth solder joints comprise at least one fourth functional solder joint located inside the solder joint array and at least one fourth non-functional solder joint located outside the solder joint array, the connection line is connected with the fourth functional solder joint, and the fourth auxiliary line is connected with the fourth non-functional solder joint.

7. The flexible printed circuit board of claim 1, wherein the bridging flexible board comprises a connection line region, a first pad region and a second pad region; wherein the connection line region is disposed between the first pad region and the second pad region, the connection line is disposed in the connection line region, the first bridging pad is disposed in the first pad region, and the second bridging pad is disposed in the second pad region;

a first connection point where the third auxiliary line is connected with the connection line is located in the connection line region, and/or a second connection point where the fourth auxiliary line is connected with the connection line is located in the connection line region.

8. The flexible printed circuit board of claim 1, wherein the bridging flexible board comprises a connection line region, a first pad region and a second pad region;

the connection line region is disposed between the first pad region and the second pad region;

the connection line is disposed in the connection line region;

the first pad region comprises a first solder joint region and a first glue dispensing region, wherein the first solder joint region is disposed in the first bridging pad, and the first glue dispensing region is disposed at a periphery of the first solder joint region, the second pad region comprises a second solder joint region and a second glue dispensing region, wherein the second bridging pad is disposed in the second solder joint region, and the second glue dispensing region is disposed at a periphery of the second solder joint region; and a first connection point where the third auxiliary line is connected with the connection line is located in the first glue dispensing region, and/or a second connection point where the fourth auxiliary line is connected with the connection line is located in the second glue dispensing region.

9. The flexible printed circuit board of claim 1, wherein a center distance between adjacent first solder joints ranges from 1.05 mm to 1.25 mm; and/or, a center distance between adjacent second solder joints ranges from 1.05 mm to 1.25 mm; and/or, a center distance between adjacent third solder joints ranges from 1.05 mm to 1.25 mm; and/or, a center distance between adjacent fourth solder joints ranges from 1.05 mm to 1.25 mm.

10. The flexible printed circuit board of claim 1, wherein the first bridging pad further comprises at least one through hole disposed between the adjacent third solder joints; and/or, the second bridging pad further comprises at least one through hole disposed between the adjacent fourth solder joints.

11. The flexible printed circuit board of claim 10, wherein a dimension of the through hole is less than or equal to 0.1 mm, and the dimension of the through hole refers to a maximum distance between any two points on an edge of the through hole.

12. The flexible printed circuit board of claim 10, wherein a center distance between the through hole and an adjacent third solder joint ranges from 0.55 mm to 0.65 mm; and/or, a center distance between the through hole and the adjacent fourth solder joint ranges from 0.55 mm to 0.65 mm.

13. The flexible printed circuit board of claim 1, wherein the bridging flexible board comprises a connection line region, the bridging flexible board is disposed on the main flexible board in a plane perpendicular to the flexible printed circuit board, and the bridging flexible board comprises a first bridging soldermask layer disposed on the main flexible board, a first bridging conductive layer disposed on a side of the first bridging soldermask layer away from the main flexible board, a bridging substrate layer disposed on a side of the first bridging conductive layer away from the main flexible board, a second bridging conductive layer disposed on a side of the bridging substrate layer away from the main flexible board, and a second bridging soldermask layer disposed on a side of the second bridging conductive layer away from the main flexible board, wherein the first bridging conductive layer is only disposed in the connection line region of the bridging flexible board.

14. The flexible printed circuit board of claim 13, wherein a distance between an edge of the third solder joint close to a side of the connection line region and an edge of the first bridging conductive layer in the connection line region close to a side of the third solder joint is greater than or equal to 1.0 mm, and/or a distance between an edge of the fourth solder joint close to the side of the connection line region and the edge of the first bridging conductive layer in the connection line region close to the side of the fourth solder joint is greater than or equal to 1.0 mm.

15. The flexible printed circuit board of claim 13, wherein the main flexible board comprises a shielding layer, a covering layer disposed on the shielding layer, a first main conductive layer disposed on a side of the covering layer away from the shielding layer, a main substrate layer disposed on a side of the first main conductive layer away from the shielding layer, a second main conductive layer disposed on a side of the main substrate layer away from the shielding layer, and a main soldermask layer disposed on a side of the second main conductive layer away from the shielding layer, wherein the first bridging soldermask layer of the bridging flexible board is in direct contact with the main soldermask layer.

16. A touch-control display apparatus comprising a touch display panel and the flexible printed circuit board of claim 1, wherein the touch display panel comprises an effective region and a binding region located at a side of the effective region, the binding region comprises a binding pin region, and the flexible printed circuit board is connected with the binding pin region, correspondingly.

17. The flexible printed circuit board of claim 2, wherein the bridging flexible board is disposed on the main flexible board in a plane perpendicular to the flexible printed circuit board, and the bridging flexible board comprises a first bridging soldermask layer disposed on the main flexible board, a first bridging conductive layer disposed on a side of the first bridging soldermask layer away from the main flexible board, a bridging substrate layer disposed on a side of the first bridging conductive layer away from the main flexible board, a second bridging conductive layer disposed on a side of the bridging substrate layer away from the main flexible board, and a second bridging soldermask layer disposed on a side of the second bridging conductive layer away from the main flexible board, wherein the first bridging conductive layer is only disposed in the connection line region of the bridging flexible board.

18. The flexible printed circuit board of claim 3, wherein the bridging flexible board is disposed on the main flexible board in a plane perpendicular to the flexible printed circuit board, and the bridging flexible board comprises a first bridging soldermask layer disposed on the main flexible board, a first bridging conductive layer disposed on a side of the first bridging soldermask layer away from the main flexible board, a bridging substrate layer disposed on a side of the first bridging conductive layer away from the main flexible board, a second bridging conductive layer disposed on a side of the bridging substrate layer away from the main flexible board, and a second bridging soldermask layer disposed on a side of the second bridging conductive layer away from the main flexible board, wherein the first bridging conductive layer is only disposed in the connection line region of the bridging flexible board.

19. A touch-control display apparatus comprising a touch display panel and the flexible printed circuit board of claim 2, wherein the touch display panel comprises an effective region and a binding region located at a side of the effective region, the binding region comprises a binding pin region, and the flexible printed circuit board is connected with the binding pin region, correspondingly.

20. A touch-control display apparatus comprising a touch display panel and the flexible printed circuit board of claim 3, wherein the touch display panel comprises an effective region and a binding region located at a side of the effective region, the binding region comprises a binding pin region, and the flexible printed circuit board is connected with the binding pin region, correspondingly.

\* \* \* \* \*